United States Patent [19]
Goetz et al.

[11] Patent Number: 5,282,147
[45] Date of Patent: Jan. 25, 1994

[54] METHOD AND APPARATUS FOR OPTIMIZING A LOGIC NETWORK

[75] Inventors: John W. Goetz; David J. Hathaway, both of Underhill, Vt.

[73] Assignee: International Business Machines Corporation, Armonk, N.Y.

[21] Appl. No.: 739,923

[22] Filed: Aug. 2, 1991

[51] Int. Cl.$^5$ .............................................. G06F 15/60
[52] U.S. Cl. ....................................... 364/489; 364/488
[58] Field of Search ................. 364/488, 489, 490, 491

[56] References Cited

U.S. PATENT DOCUMENTS

| | | | |
|---|---|---|---|
| 4,566,064 | 1/1986 | Whitaker | 364/489 |
| 4,636,966 | 1/1987 | Yamada et al. | 364/491 |
| 4,700,316 | 10/1987 | Nair | 364/488 |
| 4,703,435 | 10/1987 | Darringer et al. | 364/489 |
| 4,916,627 | 4/1990 | Hathaway | 364/490 |
| 5,003,487 | 3/1991 | Drumm et al | 364/489 |
| 5,029,102 | 7/1991 | Drumm et al. | 364/489 |
| 5,197,015 | 3/1993 | Hartoog et al. | 364/490 |
| 5,200,907 | 4/1993 | Tran | 364/490 |

Primary Examiner—Vincent N. Trans
Attorney, Agent, or Firm—J. Dennis Moore

[57] ABSTRACT

A system for optimizing a logic network including expressing the logic network as an original graph having vertices, edges which connect the vertices and which represent connections in the logic network, and inversion markings for representing inverters in the logic network; determining a fundamental cycle(s) in the original graph; sorting the determined fundamental cycle(s) according to its parity; forming a final graph by processing the fundamental cycle(s) so as to optimize inverter placement therein while maintaining the parity thereof; comparing the inversion markings of the original and final graphs to determine a set of transformation locations in the logic network; and re-configuring the logic network in accordance with the determined transformation locations.

16 Claims, 19 Drawing Sheets

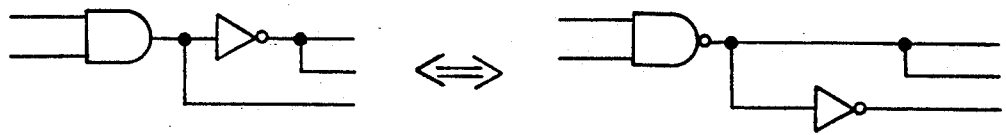
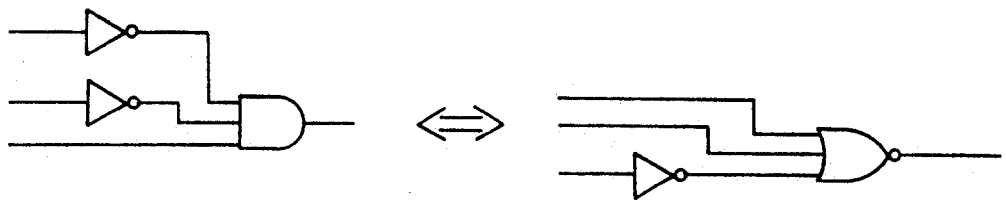
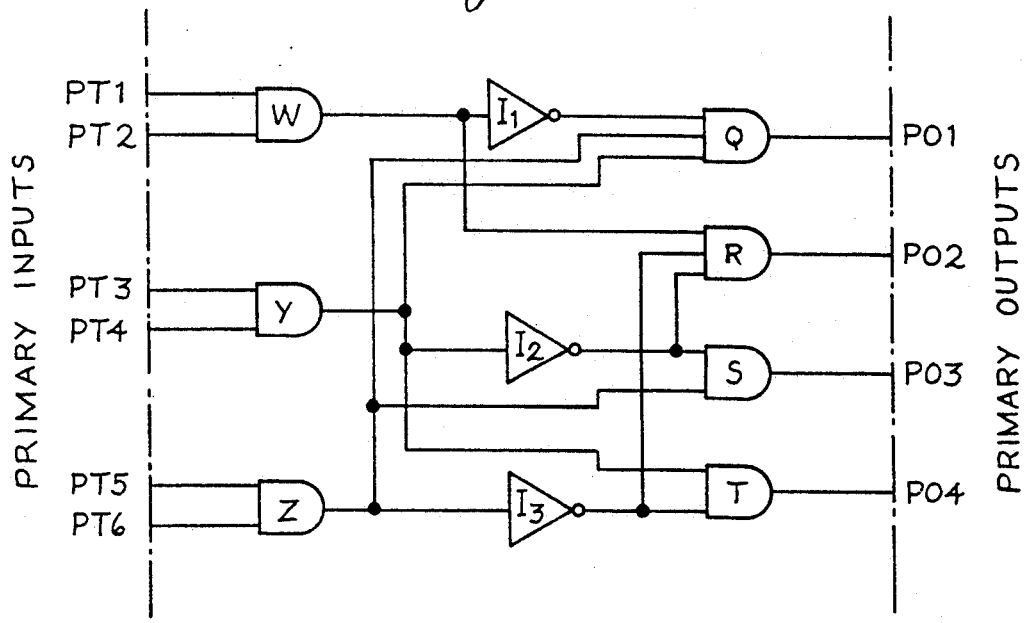

Fig. 4D.
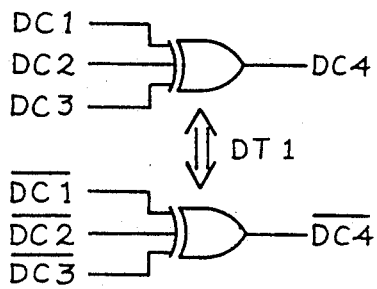
TRANSFORMATION
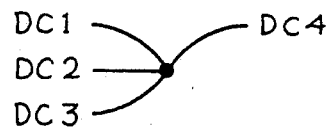
GRAPH REPRESENTATION
Fig. 4E.
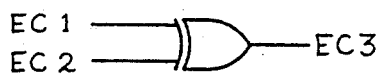
NO TRANSFORMATIONS
GRAPH REPRESENTATION
Fig. 4F.
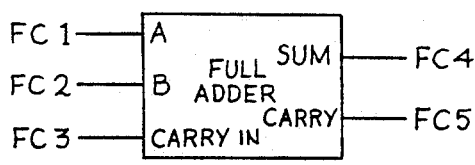
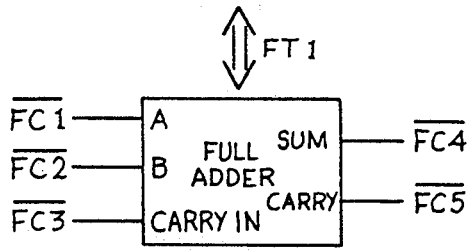
TRANSFORMATION
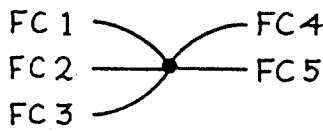
GRAPH REPRESENTATION

TRANSFORMATIONS    GRAPH REPRESENTATION

TRANSFORMATION    GRAPH REPRESENTATION

TRANSFORMATION

GRAPH REPRESENTATION

| CONNECTION | INVERSION |
|---|---|
| PI1 → W | NO |
| PI2 → W | NO |
| PI3 → Y | NO |
| PI4 → Y | NO |
| PI5 → Z | NO |
| PI6 → Z | NO |
| W → Q | YES |
| W → R | NO |
| Y → Q | NO |
| Y → S | YES |
| Y → T | NO |
| Z → Q | NO |
| Z → S | NO |
| Z → T | YES |
| Q → PO1 | NO |
| R → PO2 | NO |
| S → PO3 | NO |
| T → PO4 | NO |

Fig. 9.
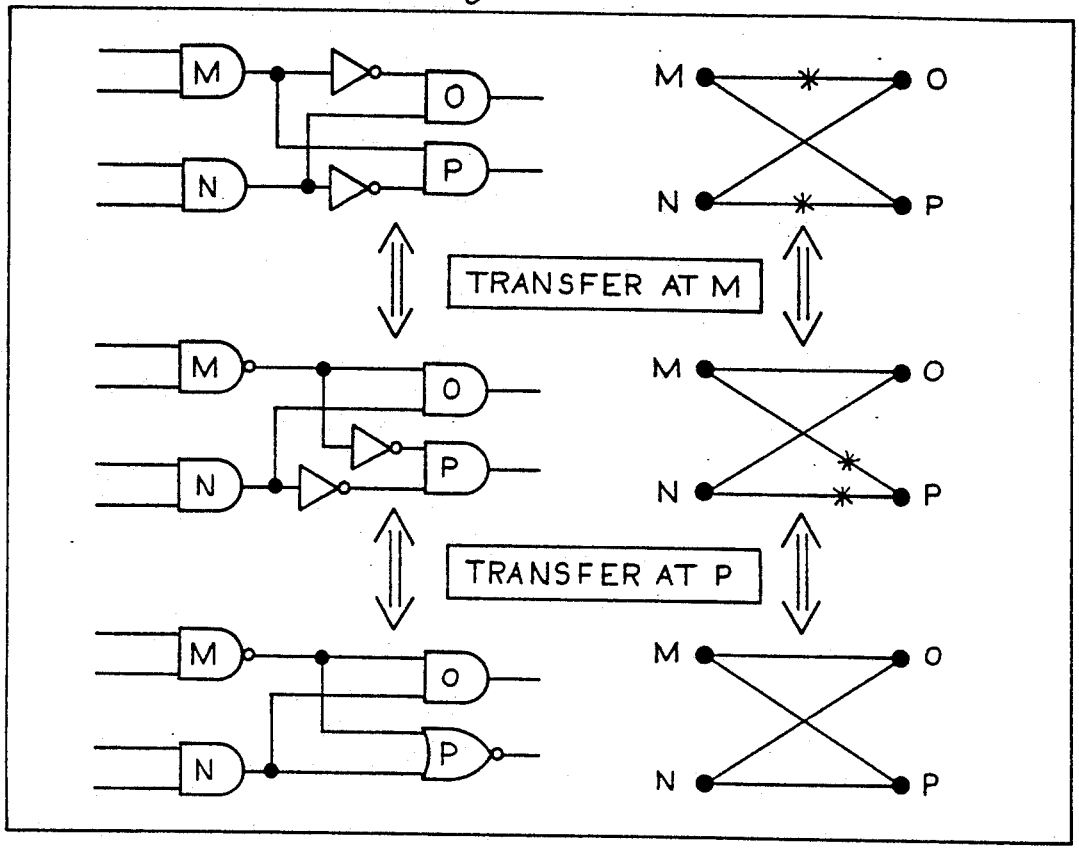
TRANSFER AT M
TRANSFER AT P
Fig. 10.
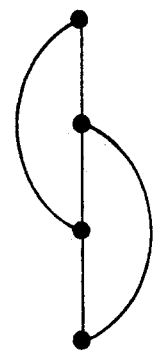
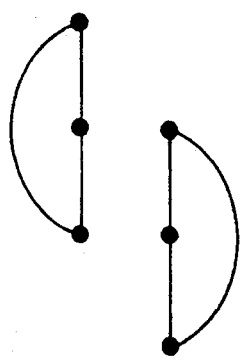
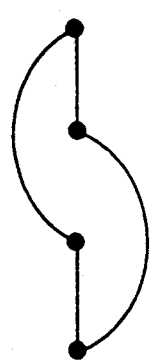
GRAPH | FUNDAMENTAL CYCLES | GENERATED CYCLE

EVEN FUNDAMENTAL CYCLES

ODD FUNDAMENTAL CYCLES

Fig. 20.
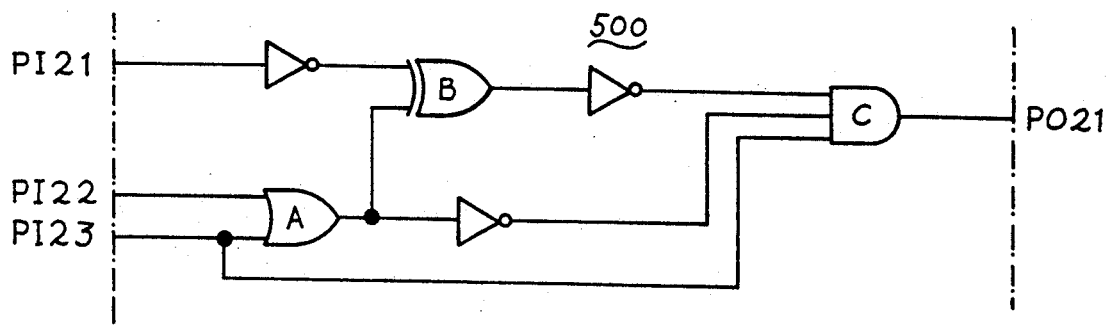
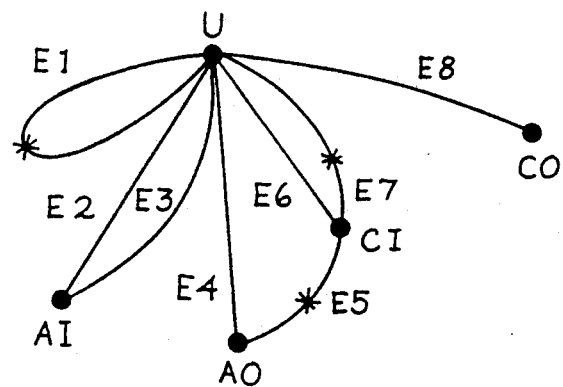
Fig. 21A.
Fig. 21B.
| EDGE | CONNECTION |
|------|------------|
| E1   | PI21-B     |
| E2   | PI22-A     |
| E3   | PI23-A     |
| E4   | A-B        |
| E5   | A-C        |
| E6   | PI23-C     |
| E7   | B-C        |
| E8   | C-PO21     |

ODD FUNDAMENTAL CYCLES

EVEN FUNDAMENTAL CYCLES

METHOD AND APPARATUS FOR OPTIMIZING A LOGIC NETWORK

FIELD OF THE INVENTION

The present invention relates to a logic synthesis method and apparatus for optimizing a logic network, including reducing the size and increasing the operation speed of the logic network.

BACKGROUND OF THE INVENTION

Many logic technologies contain a wide variety of circuits, such as AND, NAND, OR, NOR, XNOR, AND-OR, AND-NOR, OR-NAND gates, etc... It is desirable to remove circuits in order to reduce the size and increase the operating speed of the logic network. Specifically, inverters in the logic network add delay and therefore a reduction in the number of inverters in critical paths of the network will result in an increase in the operating speed of the network.

When the library of available circuits contains alternative circuits whose functions are identical except for the polarity of the input and/or output signals, it is also desirable to use the least cost circuit (e.g., the smallest) from among these alternatives.

Inverters can often be removed by "pushing" inverters into the inputs or outputs of gates, and applying transformations, such as AND to a NOR or NAND, as shown in FIG. 1. One previous method for removing inverters involved examining small sections of the logic to find locations where inverters might be "pushed" into other circuits. However, this method is deficient in that it is not capable of recognizing pairs of inverters which can be merged across long paths in the network.

Another method for reducing inverters involves making a single pass through the logic, and assigning polarities to signals during the pass. This method has not been effective since it cannot be applied to networks in which circuits have more than one fan-out.

U.S. Pat. No. 4,703,435 and "Logic Synthesis Through Local Transformations", IBM J. RES. DEVELOP, Vol. 25, No. 4, July, 1981 both by Darringer et al disclose a logic synthesizer method for synthesizing a logic network in order to minimize the number of circuit elements in the logic network. The synthesizer method includes inputting a description of the network, translating the inputted description into an initial implementation of AND/OR logic, simplifying the logic network at the AND/OR level, transforming the simplified AND/OR level into a NAND/NOR implementation, and applying simplifying transformations at the NAND/NOR level.

U.S. Pat. No. 4,916,627 to Hathaway discloses a system for reducing a logic network having several gate levels to a specified number of gate levels. The system includes levelizing the gates of the network in a forward and backward direction, specifying a scoring function, and selecting one of the gates in a determined worst path of the network in accordance with the scoring function.

The article entitled "Switching Network Logic Approach to Sequential MOS Circuit Design" by Wu et al, IEEE TRANSACTIONS ON COMPUTER-AIDED DESIGN, Vol. 8, No. 7, July, 1989, pp. 782–794, and U.S. Pat. No. 4,700,316 to Nair each discloses a synthesis method in which a logic network is re-expressed as a graph with edges.

The following are further examples of systems which attempt to reduce signal propagation time delay in logic networks.

U.S. Pat. No. 4,636,966 discloses a method of arranging logic circuit elements on a circuit board which provides an arrangement which optimize signal propagation delay time.

U.S. Pat. No. 4,566,064 discloses a logic network which employs PASS transistors as logic circuits in order to reduce signal propagation delay time relative to conventional logic circuits such as NAND, NOR and inverters.

SUMMARY OF THE INVENTION

It is an object of the present invention to provide a logic synthesis system which reduces the size of the logic network through transformations which change the polarity of signal connections in the logic network.

It is a further object of the invention to provide a logic synthesis system which increases the operation speed of the logic network through transformations which change the polarity of signal connections in the logic network.

It is still a further object of the invention to provide a logic synthesis system which reduces the number of circuit elements through transformations and which provides definite location(s) in the logic network where the transformation are to be applied.

It is still another object of the invention to provide a logic synthesis system for optimizing the logic network in which the cost of applying different transformations is compared to determine the optimal transformation(s).

These and other objects are realized by the logic synthesis system according to the invention which includes:

deriving from a logic network having several interconnected logic circuits a graph including vertices each representing a collection of signal source and/or sink connections which can be inverted together without increasing the cost of the logic network, edges which connect the vertices and which represent source to sink signal connections in the logic network, and inversion markings, provided on the edges, for representing inverters in the network;

identifying in the graph a set of fundamental cycles, and grouping these cycles according to the number of inversion markings contained therein;

processing the cycles to find the optimum inversion marking locations, and hence inverter placements therein;

determining the locations at which to apply transformations by comparing the initial and final inversion marking locations; and re-configuring the logic network by applying transformations at the determined locations and adding and deleting inverters to correspond to the determined optimum inversion marking locations.

BRIEF DESCRIPTION OF THE DRAWINGS

FIGS. 1A and 1B show various circuit transformations.

FIG. 3 is a circuit diagram showing a logic network to which the method of FIG. 2 is applied.

FIGS. 4A through 4K show transformations which can be made on portions of a logic network and their corresponding graph representations.

FIG. 5 is a table of the signal source to sink connections in the circuit of FIG. 3 indicating which are inverted.

FIG. 9 shows a portion of a circuit diagram containing two inverters and whose generated graph contains a cycle, and the effects on the generated graph of repeated application of transformations to that circuit.

FIG. 10 shows a graph, a set of fundamental cycles for the graph, and a cycle derived from a combination of the fundamental cycles.

FIG. 20 is a diagram of second logic circuit to which the method of the invention will be applied.

FIG. 21A is the graph derived from the logic circuit of FIG. 20.

FIG. 21B is a table indicating the connection in the logic circuit of FIG. 20 represented by each of the edges in the graph of FIG. 21A.

DESCRIPTION OF THE PREFERRED EMBODIMENTS

Figure 2:
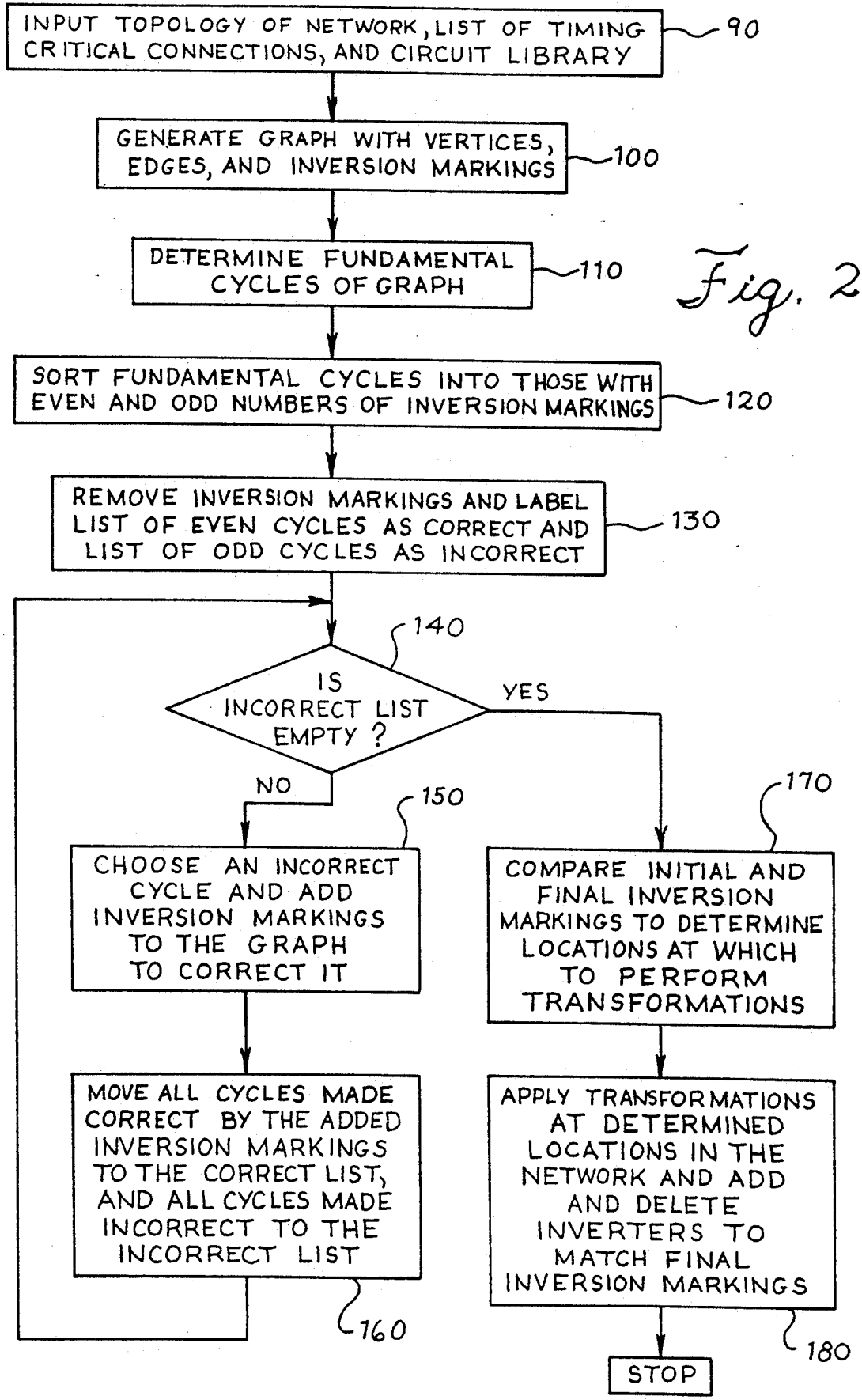
FIG. 2 is a flow chart outlining the method according to the invention.

FIG. 2 is a flow chart outlining the method according to the invention. As shown in FIG. 2, the method begins with step 90 in which the topology of the logic network is input to a general purpose computer, along with a list of the timing critical connections in the logic network and a list of the available circuit library elements. The method then proceeds to step 100 in which a graph is generated from the inputted logic network including vertices, edges, and inversion markings. Once the graph is generated, the fundamental cycles of the graph are determined in step 110. These fundamental cycles are then sorted in step 120 into odd and even fundamental cycles according to whether they contain an odd or even number of edges with inversion markings, respectively. The original inversion markings of the graph are then removed in step 130 and the set of odd fundamental cycles previously determined in step 120 are marked as incorrect, while the set of even fundamental cycles previously determined in step 120 are marked as correct.

The method next proceeds to the inquiry of step 140 which determines whether or not the list of incorrect fundamental cycles is empty. If the answer is no, the method proceeds to step 150 in which a fundamental cycle is chosen from the incorrect list and inversion markings are added to correct it. The method then proceeds to step 160 in which all incorrect fundamental cycles which were made correct by the inversion markings added in the preceding step 150 are moved to the correct list, and all correct fundamental cycles which were made incorrect by the inversion markings added in the preceding step 150 are moved to the incorrect list. The method then returns to repeat the inquiry and decision of step 140.

In the event that the answer to the inquiry of step 140 is yes, the method then proceeds to step 170 in which the initial inversions of the graph as generated in step 100 are compared with the final inversion markings of the graph. From this comparison, locations at which transformations should be applied are determined. The method then proceeds to a final step 180 in which transformations are applied to the logic network at the locations determined in step 170, and the inverters are added and removed from the logic network to match the final inversion markings of the graph.

Each of the steps 90, 100, 110, 120, 130, 140, 150, 160, 170, and 180 outlined in FIG. 2 will now be described in detail by way of an example. Specifically, the method will be applied to the logic network 200 shown in FIG. 3 which includes inverters I1, I2 and I3, and AND gates W, Y, Z, Q, R, S and T.

As indicated in FIG. 2, in the first step 90 of the method the topology of the logic network is input. In this example, the method is applied to minimize the number of inverters I1-I3 of the logic network 200 (FIG. 3) which are connected between outputs of AND gates W, Y and Z, and inputs of AND gates Q, R, S and T. There are no connections marked as timing critical, so the list of timing critical connections will be empty. The list of available circuit library elements will include NOT (inverter), AND, OR, NAND, and NOR gates.

As indicated in FIG. 2, the next step 100 of the method is performed to generate a graph from the logic network. This graph is composed of vertices each of which represents a collection of signal source and/or sink connections which can be inverted together, without increasing the cost of the logic network, edges which connect the vertices and which represent source to sink signal connections in the logic network, including connections through inverters, and inversion markings on edges which indicate source to sink signal connections on which an inverter is present. Each vertex must represent a set of transformations which can be applied independently from the transformations represented by all other vertices in the graph.

The sets of signal source and/or sink connections in the logic network which can be inverted together without increasing the cost of the logic network, and for which vertices in the graph will therefore be generated, is determined by examining the set of elements available in the circuit library. FIGS. 4A through 4I show transformations which can be applied and the graph structure corresponding to them. Horizontal bars over the connection labels indicate that those connections have been inverted.

Figure 4A:
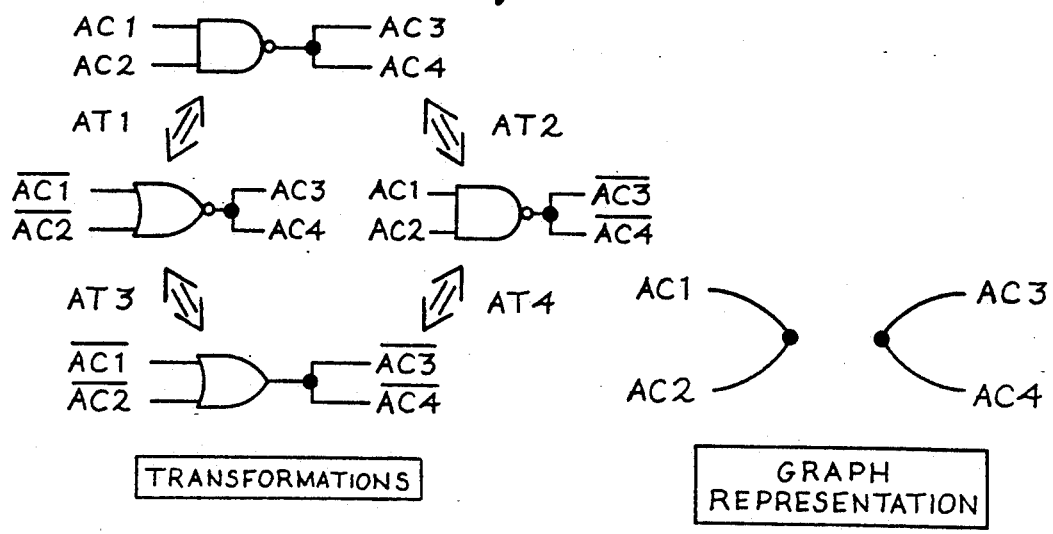

FIG. 4A shows transformations which can be made given a circuit library including AND, OR, NAND, and NOR gates, all with equal cost (e.g., equal size and performance). Transformations AT1 and AT4 cause the inversion of all input connections to the gate, and transformations AT2 and AT3 cause the inversion of all connections of the output signal of the gate. Because either transformation AT1 or AT4 can always be performed, regardless of whether transformations AT2 and AT3 are performed, one vertex is generated in the graph to represent the input signal connections AC1 and AC2, and a separate vertex is generated to represent the output signal connections AC3 and AC4.

Figure 4B:
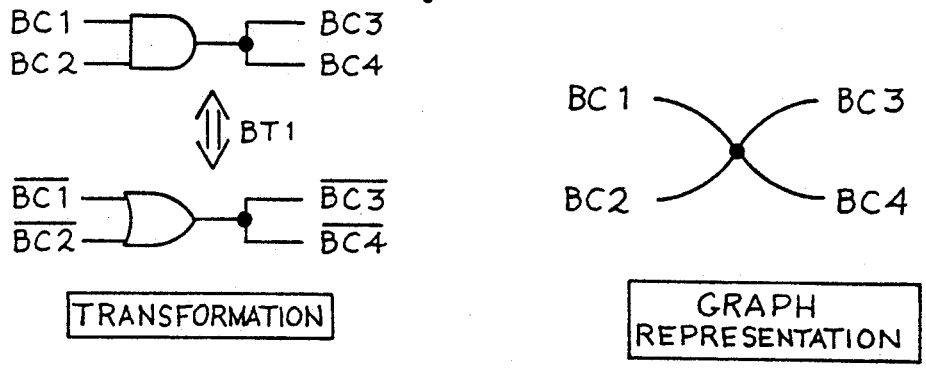

FIG. 4B shows the transformation which can be made if the circuit library contained only AND and OR gates. Transformation BT1 is the same as a combination of transformations AT1 and AT3 or AT2 and AT4 in FIG. 4A, but because these transformations cannot be performed independently, a single vertex is generated to represent connections BC1, BC2, BC3, and BC4.

Figure 4C:
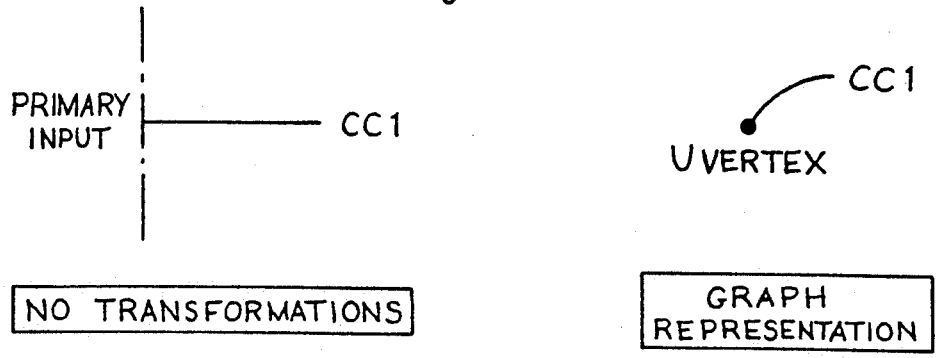

FIG. 4C shows a primary input to a logic network. The polarity of such a primary input is generally part of the specification of the logic network, and therefore cannot be changed. This is represented by connecting the edges representing the connections to the primary input, and in general edges representing all fixed polarity connections in the logic network, to a single uninvertible vertex U in the graph. Because vertex U represents all uninvertible connections in the logic network, there is no transformation which can directly invert all the connections represented by edges incident on vertex U. These connections can all be inverted at their other ends, however, by performing the transformation associated with every other vertex in the graph, since this will invert each edge not incident on vertex U twice (once from each end), causing no net inversion change, while inverting the edges incident on vertex U only once, leaving them inverted.

FIG. 4D shows the transformation which can be made on an EXCLUSIVE OR (XOR) gate with an odd number of inputs. In an XOR gate any even number of the connections among the input connections and the output signal connection can be inverted without changing the function of the XOR gate. For example, one input connection and one output connection, or two input connections and no output connections. Although the only transformation shown in FIG. 4D includes the inversion of all connections, i.e., three inputs and one output connections of the XOR gate represented by a single vertex in the graph, other transformations which involve the inversion of some smaller even set of connections to the XOR gate are also possible, and will be discussed below in connection with step 150. FIG. 4E shows and an XOR gate with an even number of inputs. Because this XOR gate has an odd number of total connections, including the output signal connection, the connections cannot all be inverted as was the case for the XOR with an odd number of inputs. The connections to the gate are therefore represented in the graph as connections to vertex U. It will be understood that alternative representations of XOR gates in the graph are possible, corresponding to inversions of various even numbered sets of connections to the XOR gate.

FIG. 4F shows the transformation which can be applied on a FULL ADDER circuit. Because the function of a FULL ADDER circuit is unchanged when all its input and output connections are inverted, it is represented by a single vertex in the graph.

Figure 4G:
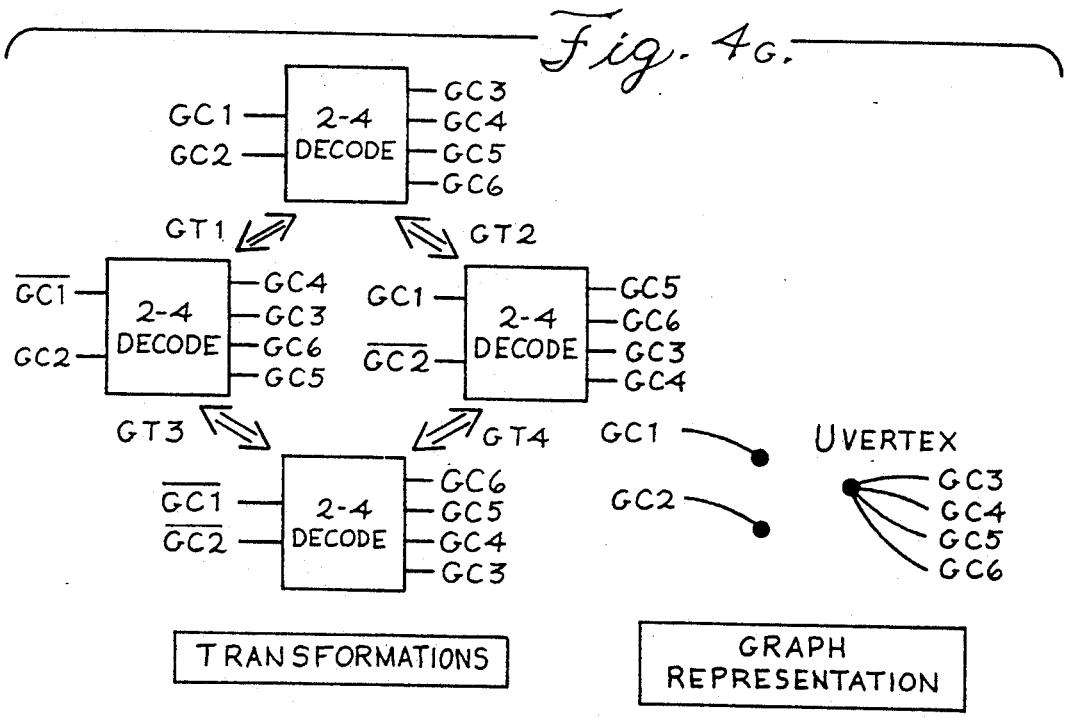

FIG. 4G shows the transformations which can be applied to a DECODER. Because any input can be inverted by rearranging the output signal connections, a separate vertex is generated in the graph for each input connection. Because no DECODER with active low outputs is assumed to be available in the circuit library, all output connections are represented by connections to vertex U.

Figure 4H:
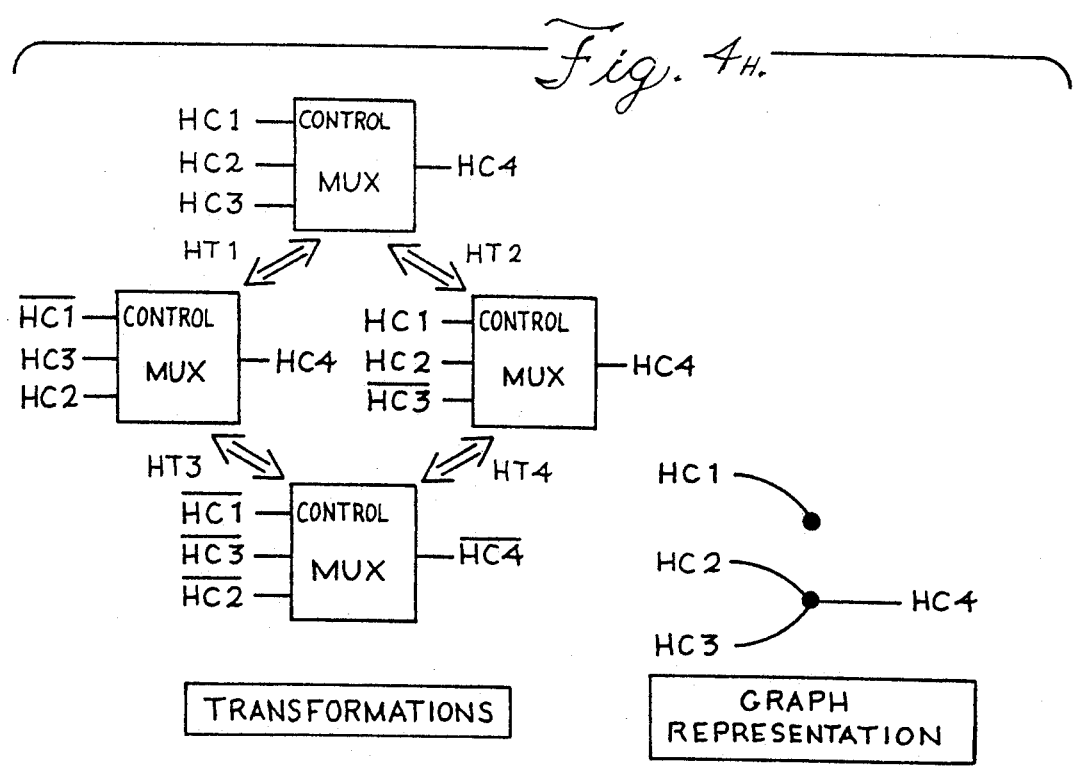

FIG. 4H shows the transformations which can be applied to a MULTIPLEXOR (MUX). Because any control input can be inverted by rearranging the data input connections, a separate vertex is generated in the graph for each control input connection. Because all data input and output connections can be inverted without changing the MUX function, a single vertex is generated in the graph for all of these data connections.

Figure 4I:
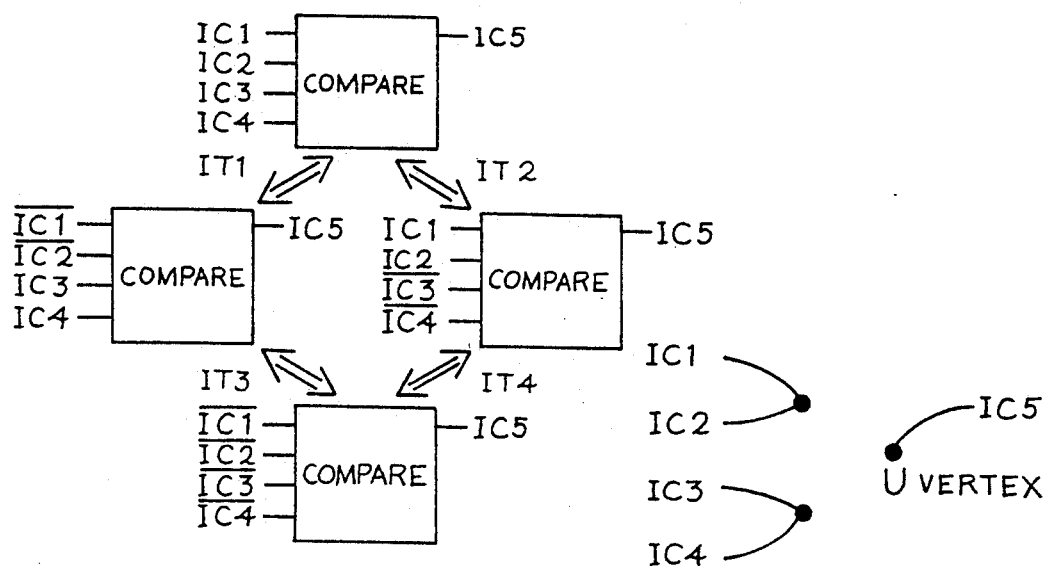

FIG. 4I shows the transformations which can be applied to a COMPARATOR. Because each pair of bits being compared can be inverted together without changing the COMPARATOR function, a vertex is generated in the graph to represent each pair of bits being compared. Because no COMPARATOR with an active low output is assumed to be available in the circuit library, the output connection is represented by a connection to vertex U.

Figure 4J:
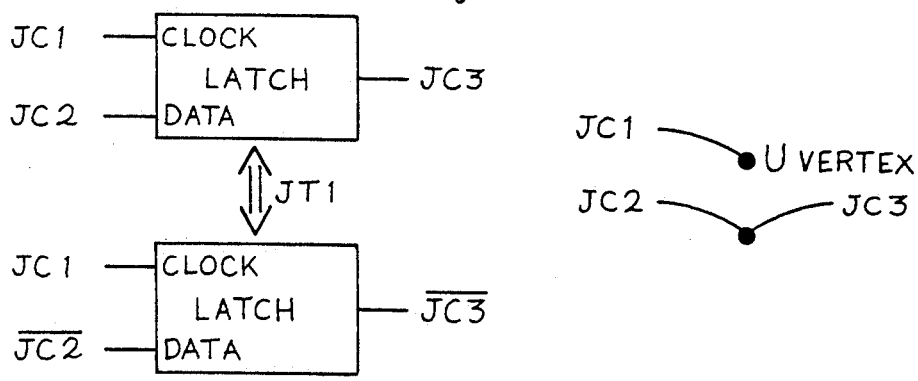

FIG. 4J shows the transformations which can be applied to a simple clocked latch. Because the data input and output can be inverted together without changing the latch function, a single vertex is generated in the graph to represent both of these data connections.

Figures 4K, 5:
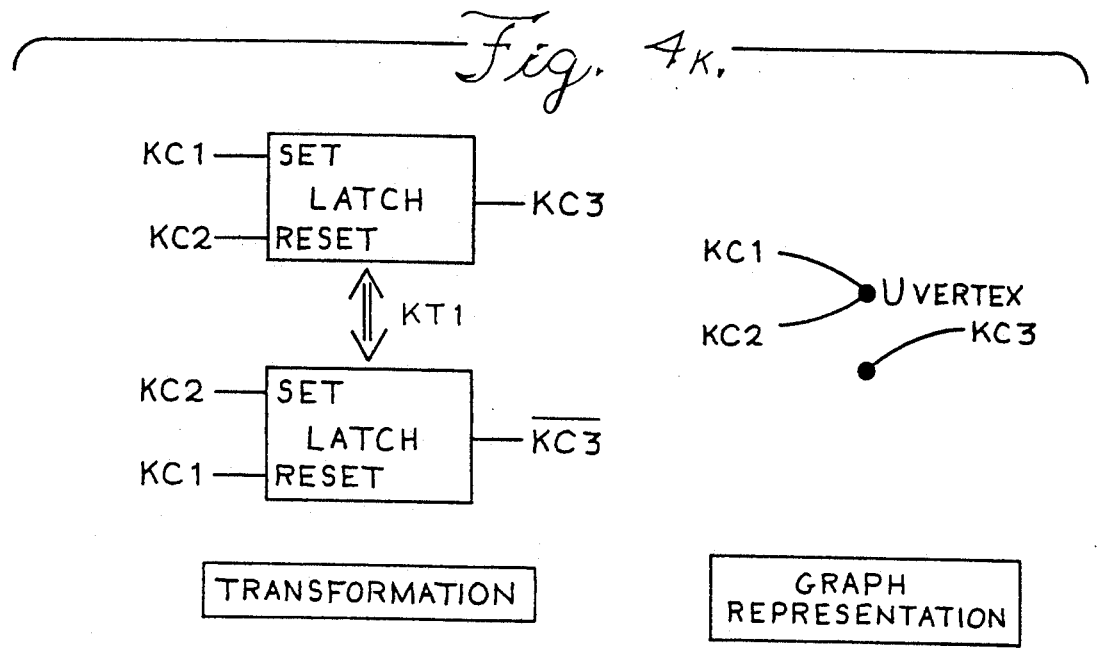

FIG. 4K shows the transformations which can be applied to a simple set-reset latch.

It will be understood that additional transformations causing the cost-free inversion of a set of signal source and/or sink connections may be possible beyond those described above depending on the library of available circuits, and that the step of generating the graph may include generation of vertices corresponding to any such transformations. It will also be understood that the process of generating the graph could be performed by adding information in order to augment the logic network within the general purpose computer in which the method is implemented rather than constructing a separate graph representation.

Because the circuit library inputted with the circuit in FIG. 3 includes AND, OR, NAND, and NOR gates, each AND gate in the logic network will be represented in the graph by a pair of vertices, as shown in FIG. 4A.

Figure 6:
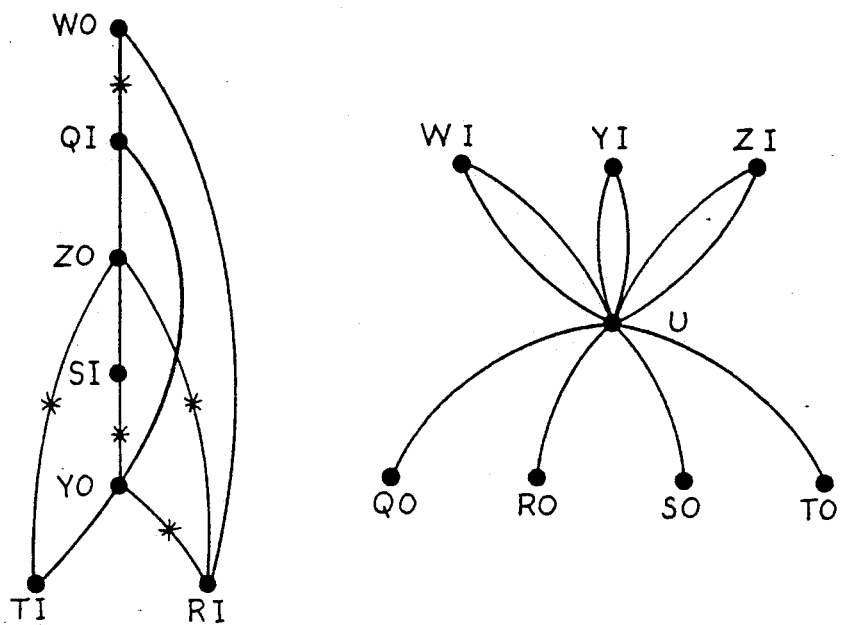
FIG. 6 is the graph generated from the circuit of FIG. 3.

FIG. 5 is a table listing the signal source to sink connections in the circuit of FIG. 3 for which graph edges must be generated in step 100 and an indication as to whether or not one of the inverters I1, I2 or I3 is disposed along a connection. For example, the connection between AND gates W and Q in FIG. 3 includes inverter I1 ("YES" in FIG. 5), whereas the connection between AND gates W and R does not include any inverters ("NO" in FIG. 5). The graph generated in step 100 (FIG. 2) for the circuit of FIG. 3 is shown in FIG. 6. Vertices labeled WI, YI, ZI, QI, RI, and SI represent connections to the inputs of gates W, Y, Z, Q, R, S, and T, respectively, while vertices labeled WO, YO, ZO, QO, RO, SO, and TO represent connections to the outputs of gates W, Y, Z, Q, R, S, and T, respectively.

Inversion markings on edges are indicated by an asterisk (*) on the edge.

Figure 7:
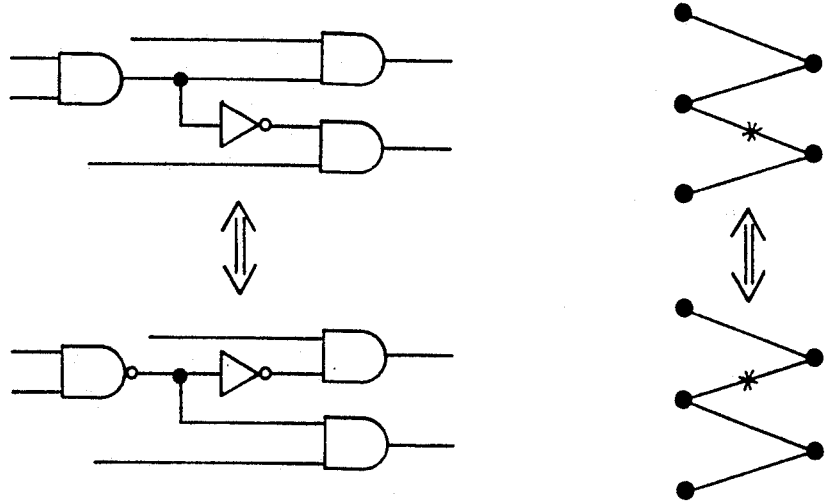
FIG. 7 shows a portion of a circuit diagram and the effect on the graph derived from that circuit of the application of a transformation to that circuit.

The purpose of the graph generated in step 100 will be understood by observing that applying to the logic network the transformation corresponding to some vertex V in the graph will convert the original network to a "new" network whose generated graph is identical to that derived from the original network except that all edges incident on vertex V which had inversion markings in the graph generated from the original network no longer have inversion markings, and all edges incident on vertex V which did not have inversion markings in the graph generated from the original network now have inversions. This is shown on a portion of a logic network in FIG. 7. Thus, a sequence of applications to the logic network of transformations corresponding to vertices in the graph has the effect of moving the inverters of the network, and hence the inversion markings of the graph.

Figure 8A:
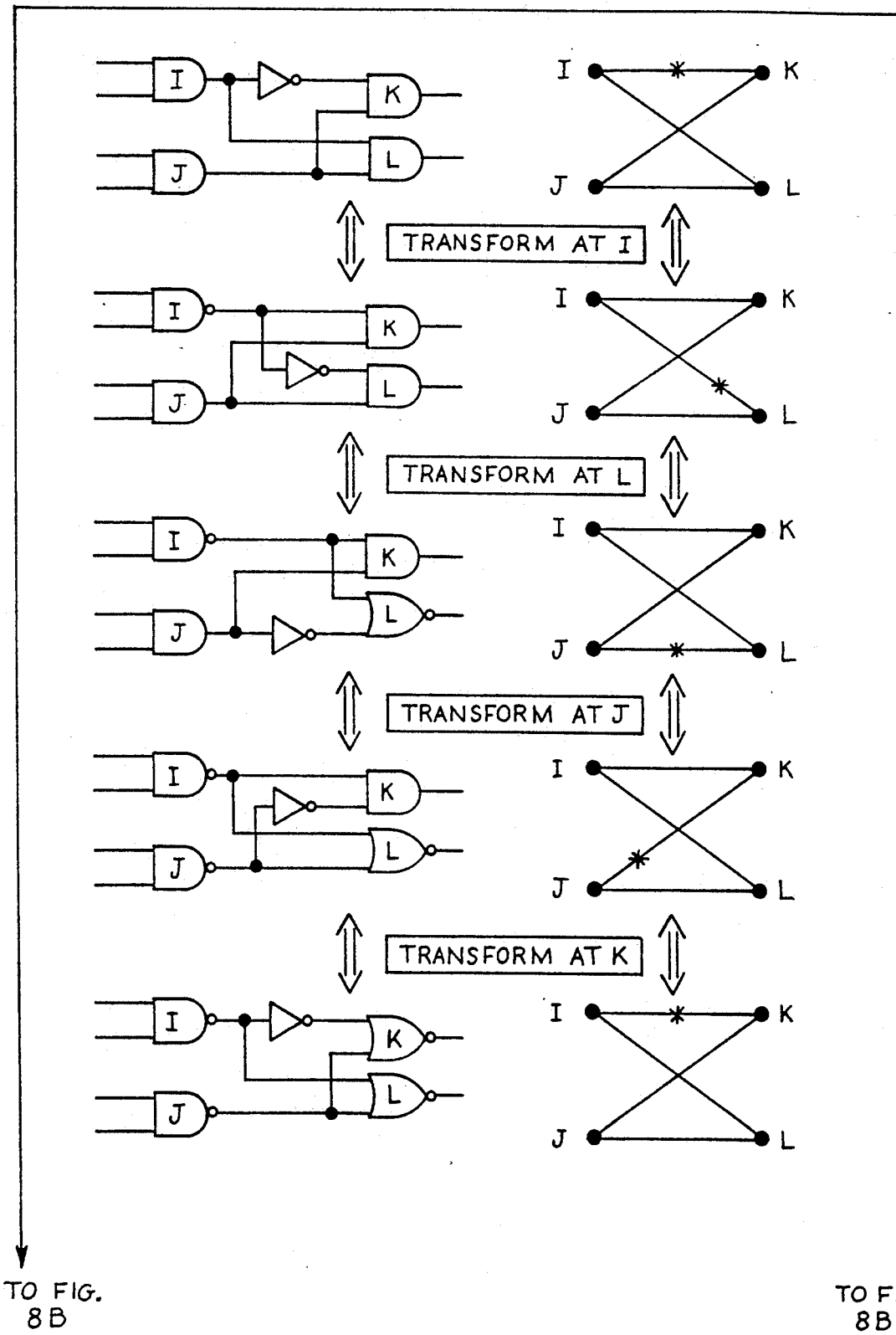
FIGS. 8A and 8B show a portion of a circuit diagram containing a single inverter and whose generated graph contains a cycle, and the effects on the generated graph of repeated application of transformations to that circuit.
Figure 8B:
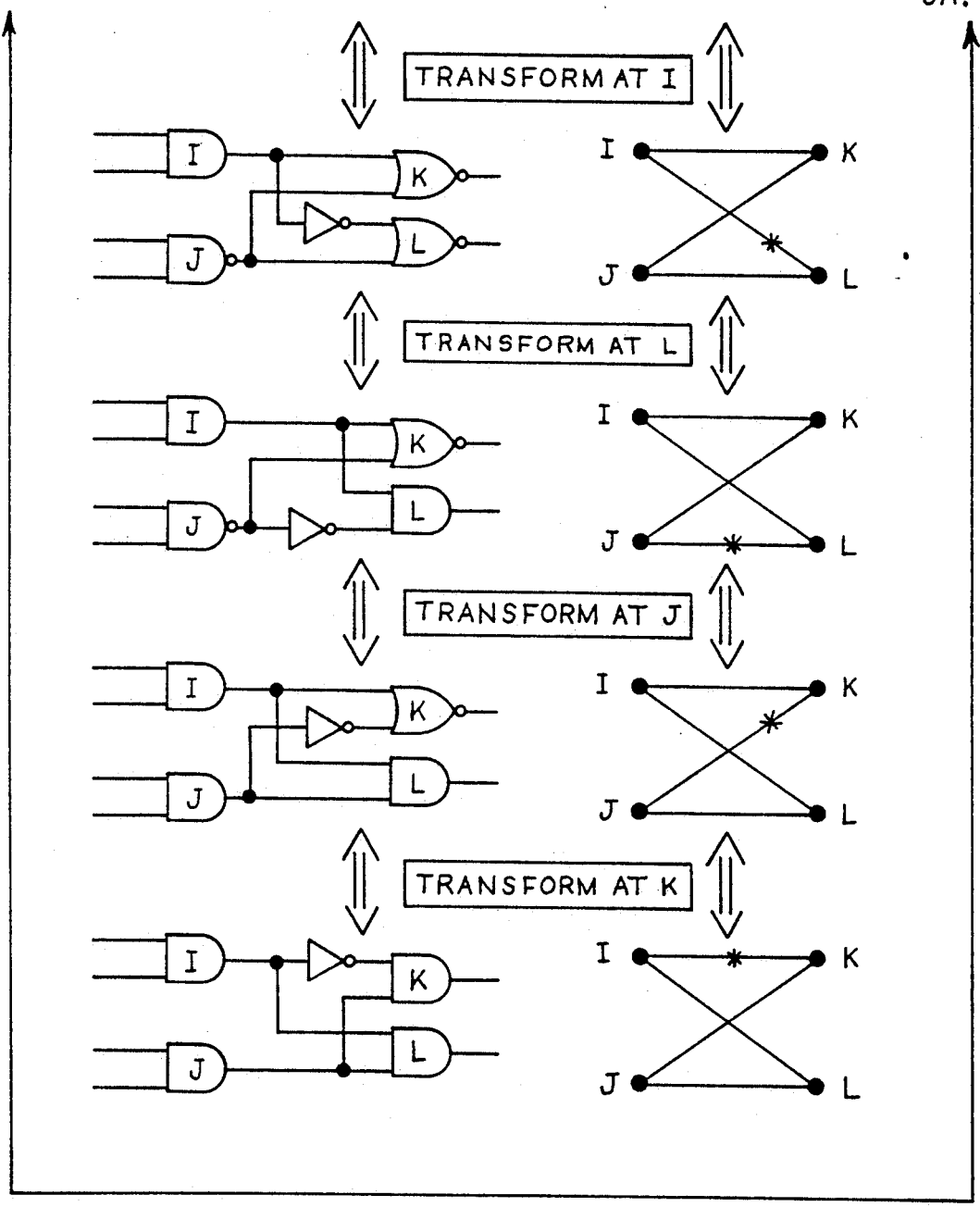

FIG. 8 shows a portion of a logic network containing a single inverter and the graph generated therefrom. The vertices of the graph labeled I and J represent the connections to the outputs of the similarly labelled gates, and the vertices labelled K and L represent the inputs of the similarly labelled gates. This graph contains a cycle from I to K to J to L and back to I. As is demonstrated in FIG. 8, the single inverted in the circuit and the single inversion marking in the graph can be moved around by successive applications of transformations, but cannot be eliminated. In contrast, FIG. 9 shows a portion of a logic network containing two inverters. It can be seen that both of these inverters can be removed after two applications of transformations.

In general, a sequence of transformations can be applied to the logic network to move the inversion markings from any initial set of edges to any other set of edges such that every cycle which had an even number (including zero) of inversion markings in the original graph marking also has an even number of inversion markings in the final graph marking, and every cycle which had an odd number of inversion markings in the original graph marking also has an odd number of inversion markings in the final graph marking. The oddness or evenness of the number of inversion markings in a cycle will be called the "parity" of the cycle.

Continuing with the application of the method of the invention to the circuit of FIG. 3, after the graph has been generated in step 100 (FIG. 2) a set of fundamental cycles for the graph is obtained in step 110. The concept of fundamental cycles of a graph is well known in graph theory. A set of fundamental cycles of a graph is a set of cycles of the graph from which all other cycles of the graph can be generated, such that no cycle in the fundamental cycle set can be generated from the remaining cycles in the fundamental cycle set. A cycle can be generated from a pair of cycles only if the cycles share at least one edge. The generated cycle then includes all edges which are in exactly one of the cycles from which it was generated and excludes all edges which are in both of the cycles from which it is generated. A cycle generated in this manner can then be paired with other cycles to create still more cycles.

FIG. 10 shows a graph, a set of two fundamental cycles for the graph, and the cycle generated from them. Fundamental cycles are useful because the number of elements in any set of fundamental cycles is linear in the size of the graph, while the total number of cycles in a graph may be exponential in the size of the graph.

Any alternative set of inversion markings on a graph such that the parity of each fundamental cycle is the same in the original graph, as in the alternatively marked graph, also preserves the parity of every other cycle in the graph, and therefore can be derived from the original graph by a sequence of applications of transformations at the vertices of the graph. One method of generating a set of fundamental cycles for a graph is to generate a spanning tree of the graph by performing a depth first search of the graph, which is a technique well known in graph theory. Every edge of the graph which is not part of the spanning tree is called a back edge, and each back edge, combined with the path connecting the endpoints of that back edge, forms one fundamental cycle in a set of fundamental cycles.

Figure 11A:
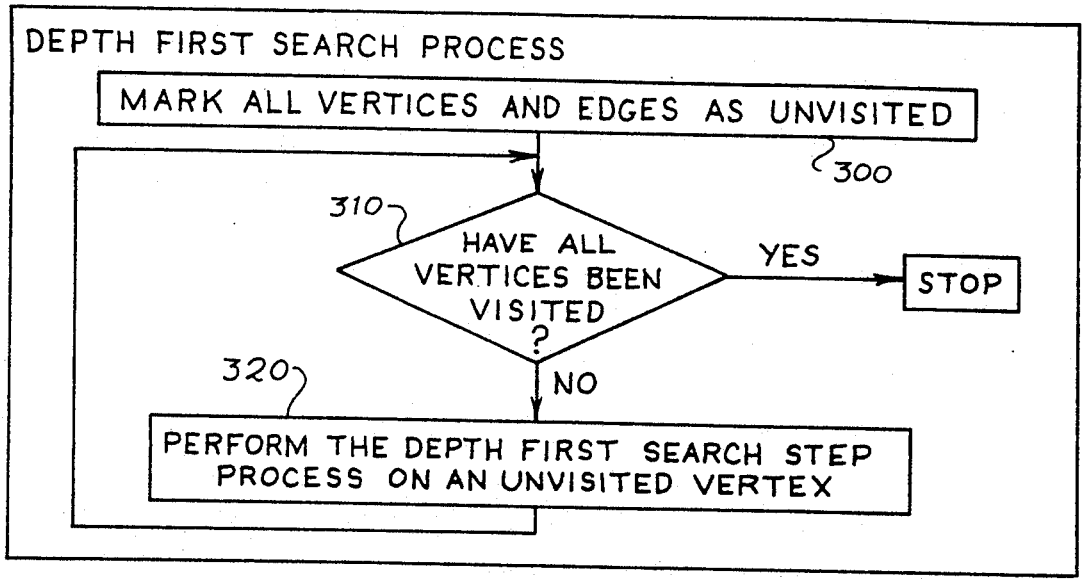
FIGS. 11A and 11B flow chart showing the steps of the depth first search process.
Figure 11B:
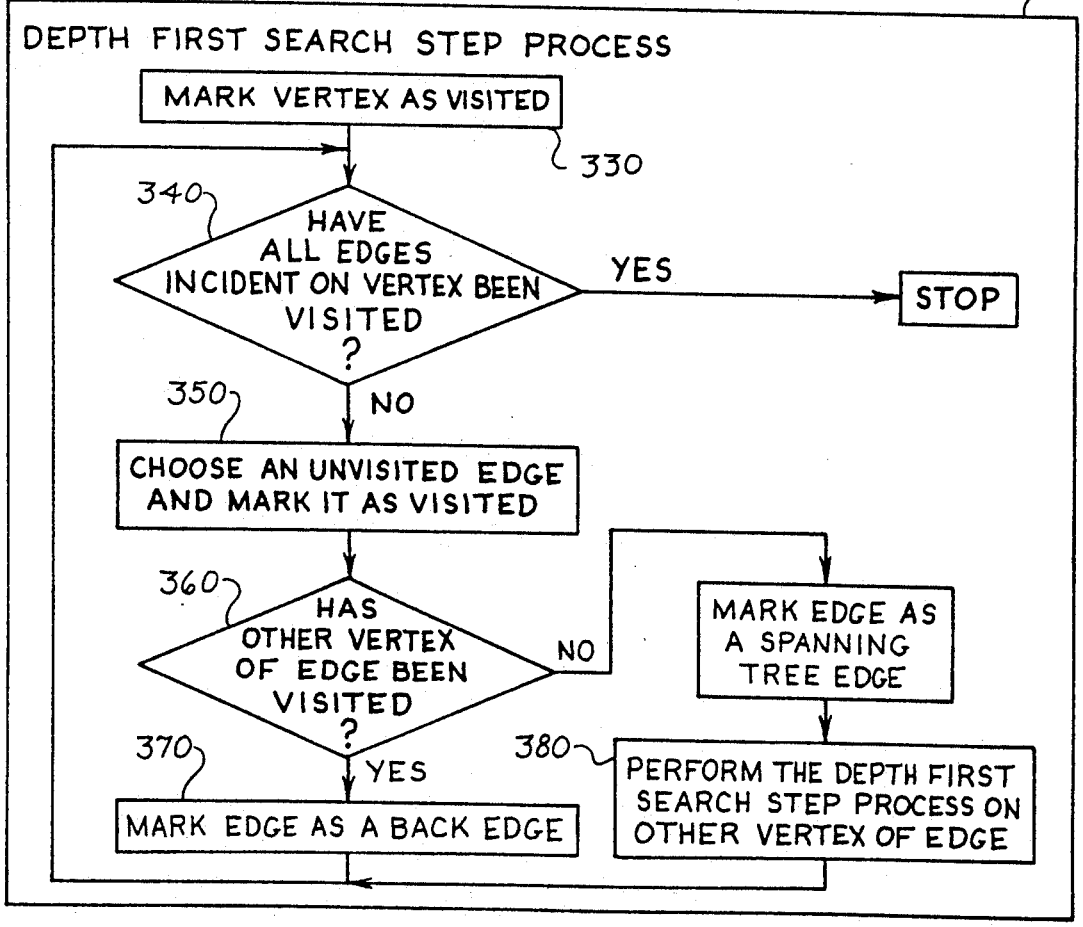

The depth first search used to determine the fundamental cycles of the graph will now be described in connection with flow chart of FIG. 11.

The Depth First Search process (DFS) begins by marking all vertices and edges of the graph as unvisited in step 300. DFS then proceeds to the inquiry in step 310 which asks whether all vertices have been visited. If the answer is NO, DFS then proceeds to step 320, in which the Depth First Search Step process (DFSS) is performed on any unvisited vertex of the graph. DFS then returns to the inquiry of step 310, and when the answer to this inquiry is YES, DFS is completed. DFSS begins by marking the vertex to which it is applied as visited in step 330. DFSS then proceeds to inquiry of step 340 which asks whether or not all edges incident on the subject vertex have been visited. If the answer is NO, DFSS then proceeds to step 350 which chooses any unvisited edge incident on the vertex and marks it as visited. From step 350 DFSS proceeds to the inquiry in step 360 which asks whether or not the vertex at the other end of the chosen edge has been visited. If the answer is YES, the chosen edge is marked as a back edge, and DFSS returns to the inquiry in step 340. If the answer to the inquiry in step 360 is no, the edge is marked as a spanning tree edge and DFSS is recursively applied to the vertex at the other end of the chosen edge, after which DFSS returns to the inquiry in step 340. When the answer to inquiry 340 is YES, DFSS is complete. Because DFSS immediately marks the vertex to which it is applied, and is applied only to unvisited vertices, it will be applied exactly once to every vertex in the graph, and DFS process will terminate.

Figure 12:
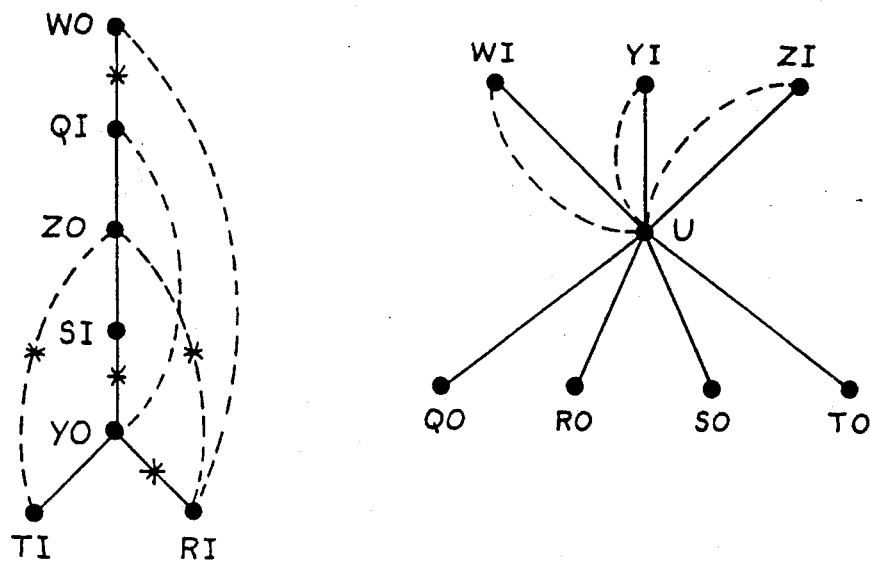
FIG. 12 shows the graph of FIG. 6 with spanning tree edges and back edges determined.

FIG. 12 shows the graph of FIG. 6 after the spanning tree edges (solid lines) and back edges (dashed edges) have been determined.

Figure 13:
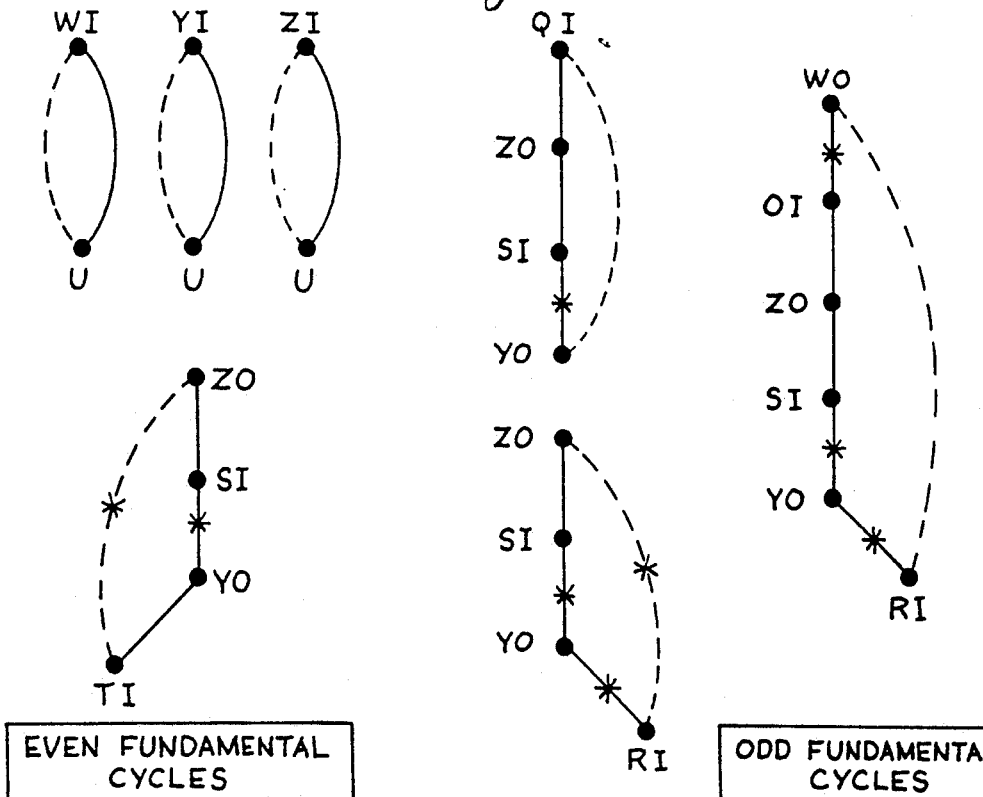
FIG. 13 shows the even and odd fundamental cycles of FIG. 11.

Once the fundamental cycles of the graph have been determined in step 110 (FIG. 2), the method proceeds to step 120 in which the fundamental cycles are sorted into two groups according to whether they have even or odd parity. FIG. 13 shows the even and odd fundamental cycles determined in the Depth First Search.

Figure 14:
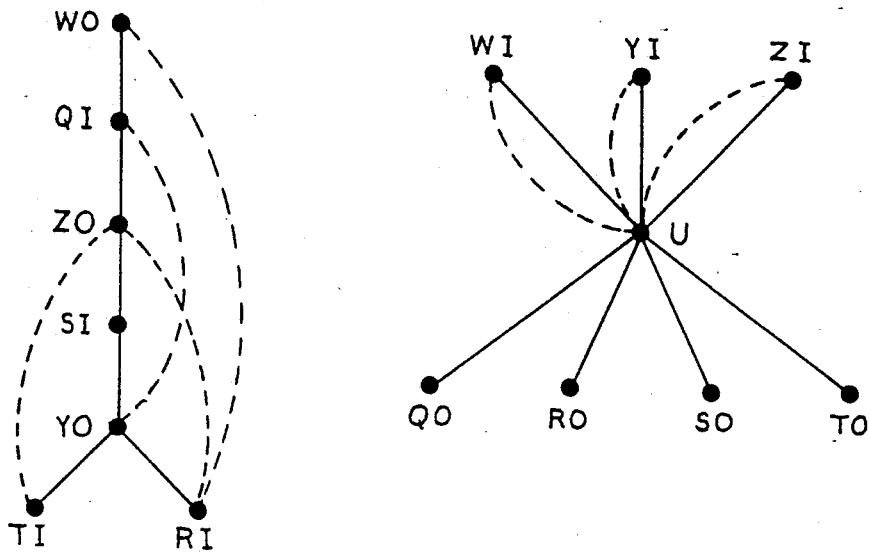
FIG. 14 shows the graph of FIG. 12 after all inversion markings have been removed.

Following step 120 the method proceeds to step 130 in which the inversion markings are removed from the graph, yielding the graph shown in FIG. 14 from that of FIG. 12. A record of the original inversion marking locations is retained for later use in step 170, which will be described below. Since all fundamental cycles now have an even number (zero) of inversion markings, there is no sequence of transformations which can change the original network into one whose derived graph has no inversion markings (i.e., a network with no inverters) if any odd fundamental cycles were identified in step 120. The task in the loop formed by steps 140, 150, and 160 will then be to add a minimal number of inversion markings such that all fundamental cycles which had odd parity in the original graph are given even parity, while maintaining the parity of all fundamental cycles which had an even parity in the original graph. The list of fundamental cycles with odd parity is labelled as the "incorrect" list, since the inversion markings of these fundamental cycles must be changed to make their parity odd, while the list of fundamental cycles with even parity is labelled as "correct", since these fundamental cycles already have the correct even parity. Thus, in the graph of FIG. 14, which contains no inversion markings, each of the even fundamental cycles thereof already has the correct parity, i.e., even parity includes no inversion markings, and according to the heuristic, should not, if possible, be disturbed by applying an odd number of inversion markings along the cycle.

In the example of the circuit in FIG. 3, the incorrect list contains fundamental cycles QI-ZO-SI-YO, ZO-SI-YO-RI, and WO-QI-ZO-SI-YO-RI, while the correct list contains fundamental cycles WI-U, YI-U, ZI-U, and ZO-SI-YO-TI.

The method next proceeds to the inquiry in step 140 (FIG. 2) which asks whether or not the list of incorrect fundamental cycles is empty. If the answer is NO, the method proceeds to step 150 in which a fundamental cycle is chosen from the list of incorrect fundamental cycles, and inversion markings are added to the graph to correct it by changing its parity. A heuristic is used to choose a particular incorrect fundamental cycle. In this example a heuristic is used which chooses the smallest incorrect fundamental cycle, i.e. the incorrect fundamental cycle containing the smallest number of vertices, since it will have fewer edges on to which inversion markings may be added to change its parity. In the example of the circuit in FIG. 3, fundamental cycle QI-ZO-SI-YO will be chosen since it is smallest incorrect fundamental cycles, although ZO-SI-YO-RI could also have been chosen since it is also incorrect and of the same size.

Inversion markings added to correct a particular fundamental cycle may also change the parity of other fundamental cycles, i.e., changing them from correct to incorrect or incorrect to correct. Heuristic are therefore used to determine where inversion markings may be added to make as many incorrect fundamental cycles correct as possible while making as few correct fundamental cycles incorrect as possible. To avoid getting into a non-terminating loop the heuristic will also prohibit making incorrect any correct fundamental cycle equal in size or smaller than the one being corrected. Because each fundamental cycle generated by DFS contains a back edge not contained in any other fundamental cycle, it is always possible to correct any fundamental cycle without affecting any other fundamental cycle, by adding an inversion marking to that back edge.

A single inverter added to the circuit may have multiple fanout, and may therefore represent multiple inversion markings in the graph. The heuristic of step 150 may consider adding multiple inversion markings associated with a single signal, including those on edges which are not in the fundamental cycle chosen for correction, in order to maximize the net increase in the number of correct fundamental cycles.

If a list of timing critical connections was inputted in step 90, then the heuristic could also avoid placing inversion markings on edges corresponding to those critical connections, which would eliminate inverters from critical paths in the logic network when the network is transformed in step 180, described below.

In the example of FIG. 3, no critical connections were inputted, so step 150 will consider all possible inverters which could add inversion markings to the edges of the chosen incorrect fundamental cycle QI-ZO-SI-YO to change its parity, and will cause inversion markings to be added to ZO-TI and ZO-SI, both of which can be implemented with a single inverter on the signal fed by gate Z. This pair of markings is chosen because it adds one inversion marking to each of the incorrect fundamental cycles, making them correct, while adding two inversion markings to the correct fundamental cycle ZO-SI-YO-TI, leaving its parity unchanged and thus leaving it correct.

Figure 15:
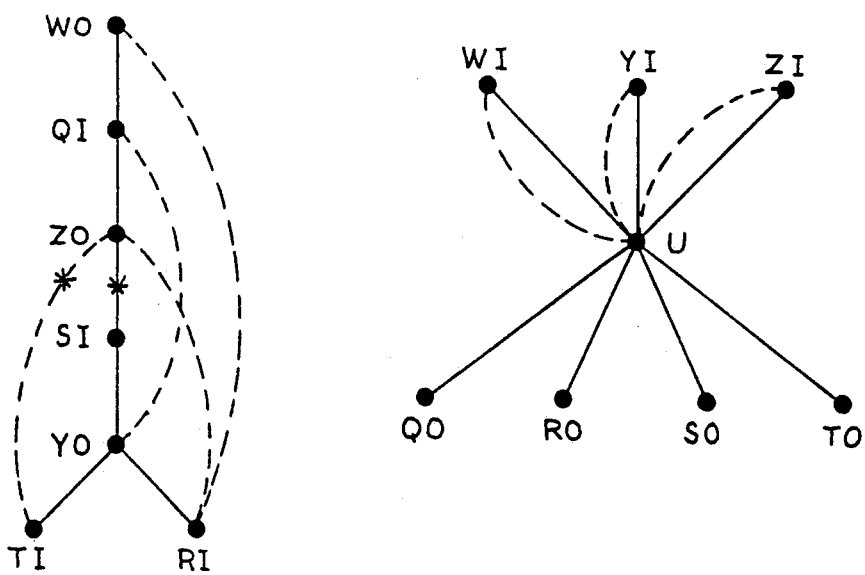
FIG. 15 shows the graph of FIG. 14 with inversion markings added to correct all fundamental cycles.

In step 160 (FIG. 2) all fundamental cycles whose parity was changed by the inversion markings added in step 150 are moved from the correct to the incorrect list or from the incorrect to the correct list. The method then returns to the inquiry in step 150. In the example of the circuit in FIG. 3, the chosen inversion markings cause all the incorrect fundamental cycles to become correct, while making none of the already correct fundamental cycles incorrect, so the answer to the inquiry in step 150 is NO, and the method proceeds to step 170. FIG. 15 shows the graph of FIG. 14 with its final inversion markings added to correct all the fundamental cycles.

It will be understood that other methods could be used for adding inversion markings to correct the parity of all fundamental cycles in the graph instead of the loop formed by steps 140, 150, and 160, including methods which simultaneously consider correcting multiple incorrect fundamental cycles.

Figure 16A:
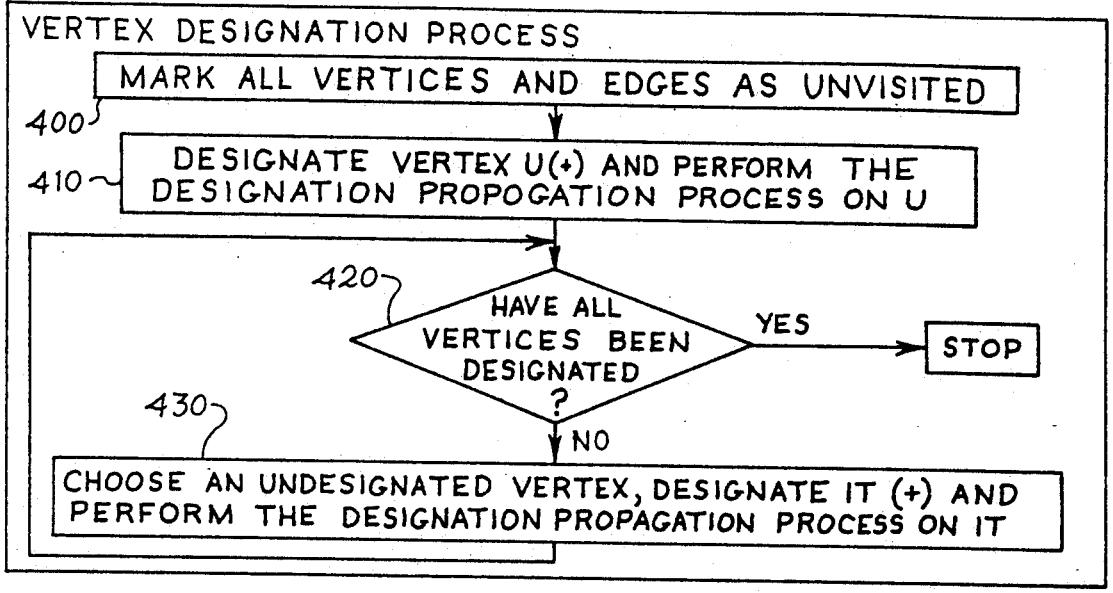
FIGS. 16A and 16B flow chart of the vertex designation process.
Figure 16B:
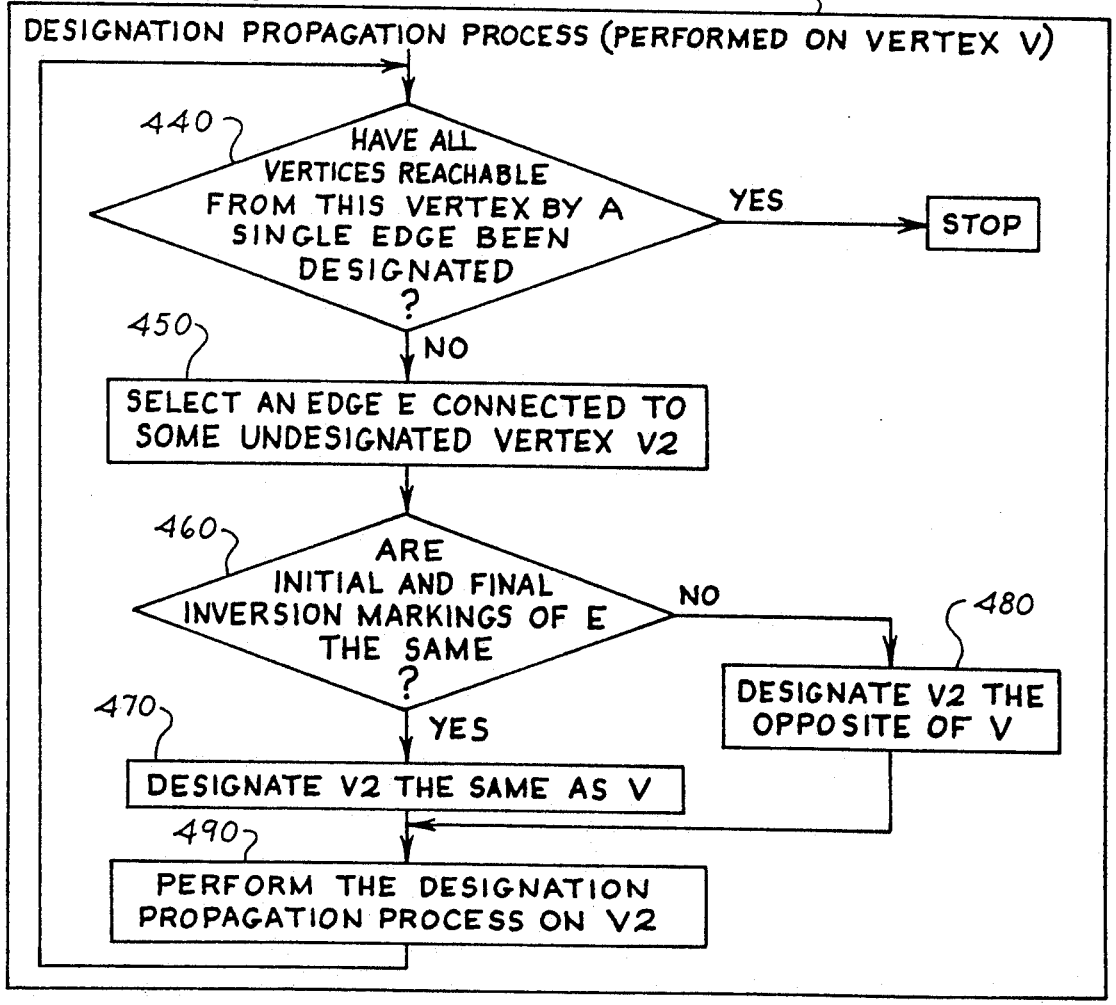

In step 170, the graph of FIG. 15 is compared with the original graph of FIG. 12, and based on this comparison, vertices of the FIG. 15 tree graph are designated as being either positive (+) or negative (−) in accordance with whether or not edge inversion markings have changed relative to the graph of step 100, i.e., the tree graph of FIG. 12. This positive/negative designation is described in the flow chart of FIG. 16.

The vertex designation process begins with step 400 in which all vertices are marked as undersignated, and then proceeds to step 410 which performs the designation propagation process, which will be described below, on the U vertex after designating it (+). The process then continues to the inquiry in step 420 which determines whether or not all vertices have been designated. If the answer is NO, the process continues to step 430 in which an arbitrary undesignated vertex is designated (+), and the vertex propagation process is performed on it. The process then returns to the inquiry of step 420, and when the answer to this is YES, the process is complete.

The designation propagation process performed on some vertex V begins with the inquiry in step 440 which asks whether or not all vertices which can be reached by a single edge from V have been designated. If the answer is NO, some edge E connected to an undersignated vertex V2 is chosen in step 450. The inquiry in step 460 then asks whether or not the initial and final markings on edge E are the same. If they are, step 470 designates vertex V2 the same as vertex V, otherwise step 480 designates vertex V2 the opposite of vertex V. After step 470 or 480, the process proceeds to step 490 in which the vertex propagation step is performed on vertex V2. The process then returns to the inquiry in step 440, and when the answer to step 440 is YES, the process is complete. The application of the vertex designation process to the graphs of FIGS. 12 and 15 will now be described.

After all vertices have been marked as undersignated in step 400, vertex U is designated (+) and the designation propagation process is performed on it. The edges U-QO, R-RO, U-SO, U-TO, either U-WI edge, either U-YI edge, and either U-ZI edge are considered in turn as edge E in the inquiry in step 450, and because the inversion markings on all of these edges is the same in the graphs of FIGS. 12 and 15, vertices QO, RO, SO, TO, WI, YI, and ZI are all designated (+), the same as vertex U. Since no other undesignated vertices are reachable from these vertices, the answer to the inquiry in step 440 is NO when the designation propagation process is applied to these vertices, meaning that no further propagation is possible in this part of the graph.

The vertex designation process then returns to the inquiry in step 420, and since undesignated vertices are still present, one of these undesignated vertices, in this case TI, is selected, designated (+), and the vertex propagation process is applied to vertex TI. In this application, edge TI-YO and vertex YO are first chosen for propagation. Because this edge has an inversion marking in neither FIG. 12 nor FIG. 15, YO is designated (+), like TI, and − the propagation continues from there. Edge YO-SI is then considered, and because the inversion marking has been removed from this edge, SI is designated (−), the opposite of YO.

Continuing on edge SI-ZO, an inversion marking has been added to this edge, so ZO is designated (+), the opposite of SI. Continuing on edge ZO-QI, this edge has an inversion marking in neither FIG. 12 nor FIG. 15, so QI is designated (+), the same as ZO. Continuing on edge QI-WO, an inversion marking has been removed from this edge, so WO is designated (−), the opposite of QI. Finally, continuing on edge WO-RI, this edge has an inversion edge in neither FIG. 12 nor FIG. 15. At this point all of the vertices of the graph have been designated, and the vertex designation process is complete.

Figure 17:
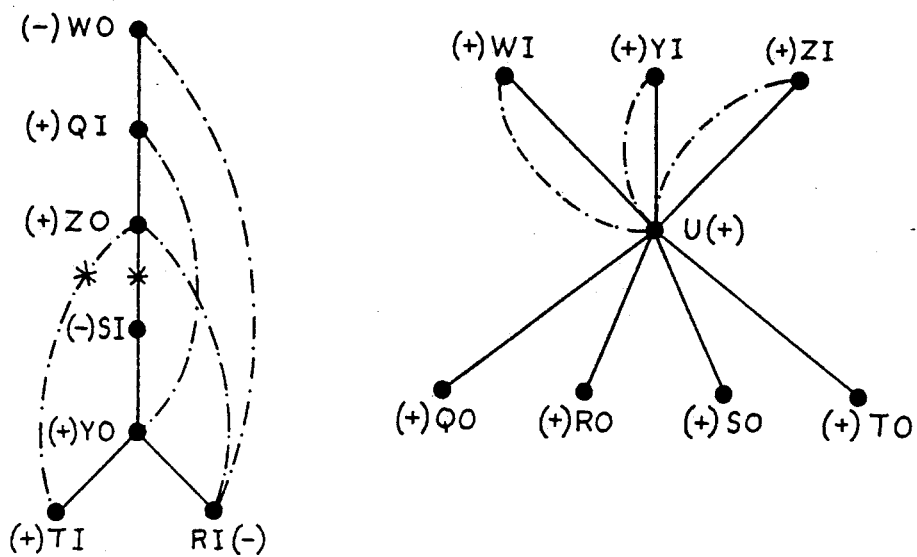
FIG. 17 shows the graph of FIG. 15 with the vertex designations.

It will be understood that because the parity of all fundamental cycles in the graphs of FIGS. 12 and 15 are the same, the same designations would have resulted on all vertices regardless of the order in which the vertices were visited, with the possible exception of a reversal of all designations each connected component of the graph not containing U, in this case the component composed of WO, QI, ZO, SI, YO, TI, and RI. FIG. 17 shows the graph of FIG. 15 with the vertex designations indicated.

Finally, the method proceeds to step 180 (FIG. 2), in which transformations are applied to the logic network at the locations corresponding to the vertices of the graph in FIG. 17 designated (−), in this case the input of gate R, the input of gate S, and the output of gate W, corresponding to vertices RI, SI, and WO, respectively. The original inverters are then removed, and inverters are inserted at locations corresponding to the inversion markings in FIG. 15. The final logic network resulting from these transformations is shown in FIG. 18.

Figure 18:
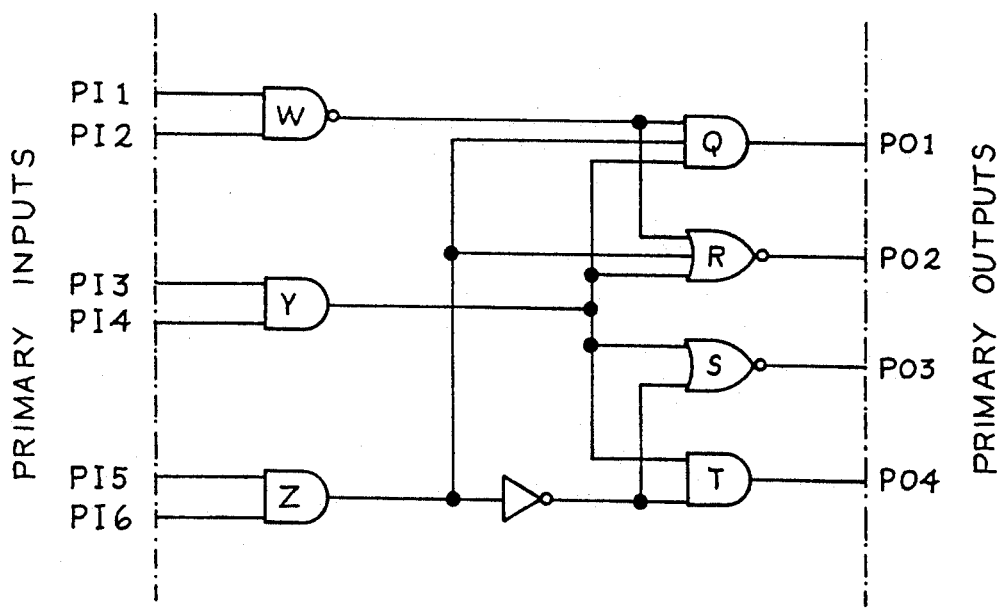
FIG. 18 shows the final result after applying the method of FIG. 2 to the circuit diagram of FIG. 3.

As shown in FIG. 18, the number of inverters of the logic network has been reduced relative to the original logic network. Further, not only is the number of inverters of the original logic network reduced, but, the method according to the invention provides an indication as to where the transformations are to be applied in the original logic i.e., at the negative (−) designated vertices, in order to reduce the number of inverters.

Figure 19A:
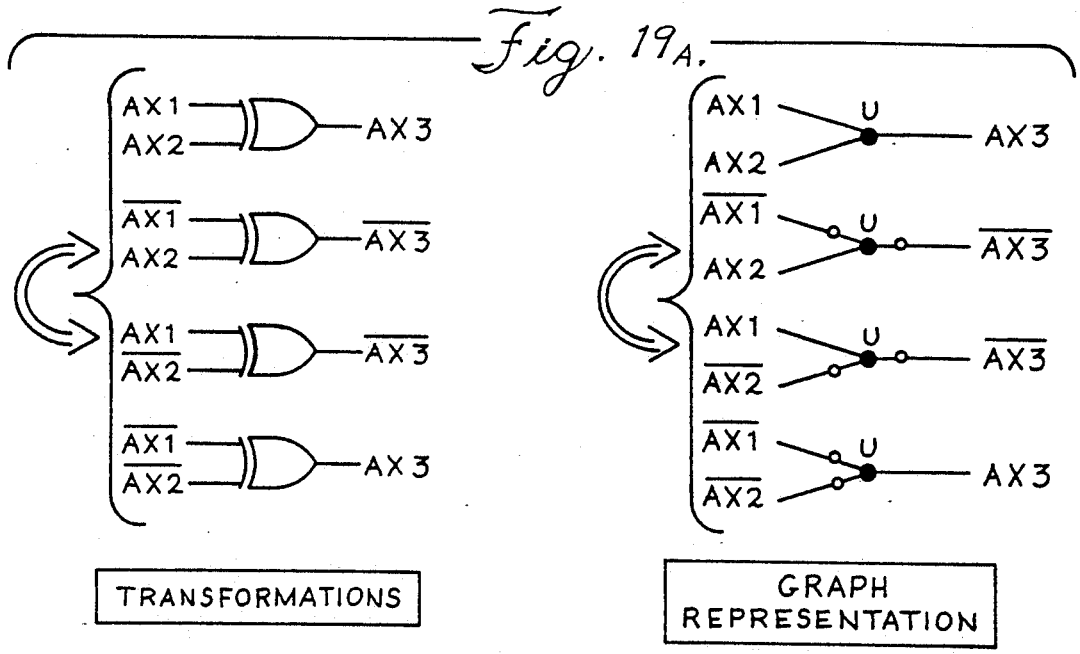
FIGS. 19A through 19C show special transformations which can be made on portions of a logic network and their graph representations.
Figure 19B:
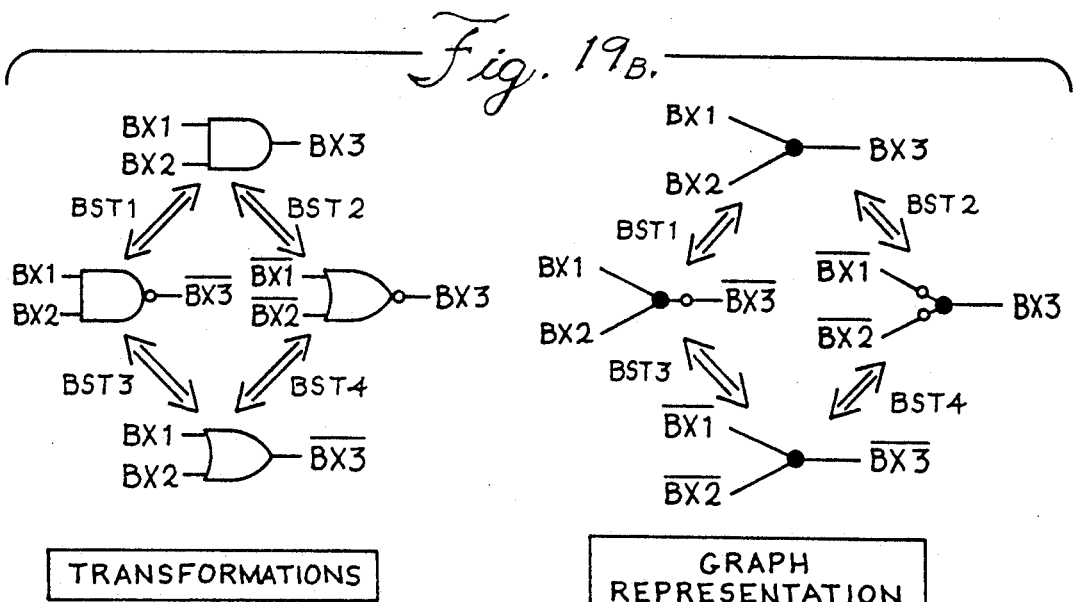
Figure 19C:
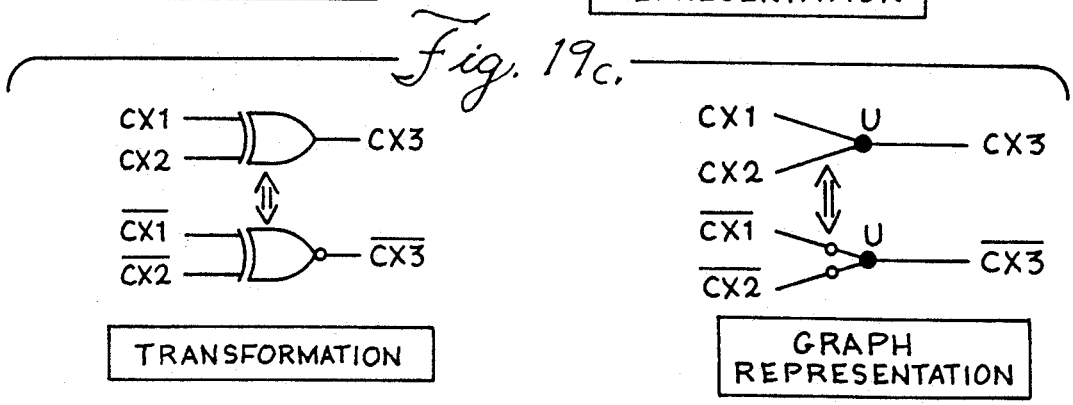

The transformations shown in FIGS. 4A through 4K and described above each involves the inversion of all connections represented by a vertex in the graph, and the transformation has no cost in terms of the criteria by which the optimality of the logic network is being measured, i.e., power, area, speed, etc... Other special transformations are possible which do not have both of these characteristics. These transformations have the effect of inverting a connection at either its source or sink without adding an inverter circuit on the connection. Some examples of these special transformations are shown in FIGS. 19A through 19C. In these figures, the inversion of a connection without the addition of an explicit inverter at a source or connection of a signal will be represented by a circle (O) on the end of the edge connected to the vertex whose representation includes that connection.

FIG. 19A shows transformations involving inversion of pairs of connections to an XOR gate. This is a special transformation because although it does not increase the cost of the logic network, it involves the inversion of only a subset of the connections represented by a single vertex in the graph.

FIG. 19B shows transformations allowed when an AND and OR of one cost (e.g., size) are available in the circuit library and an NAND and NOR of a higher cost (e.g., a larger size) are also available. The zero cost transformation in this case, involving inversion of all connections represented by the vertex, is the same as that shown in FIG. 4B and described above, while the additional special transformations involve inverting only the input or output connections represented by the vertex. In this example the zero cost transformation is the same as a combination of transformations BST1 and BST3 or BST2 and BST4. Since these combinations invert all the edges incident on the vertex, the special inversion markings (O) are not needed when all connections have been inverted.

FIG. 19C shows a transformation allowed when an XOR of one cost is available in the circuit library and an EXCLUSIVE NOR (XNOR) of a higher cost is also available. Although all edges show to the vertex are given special inversion marks, it will be understood that because the vertex in question is the unique U vertex in the graph, it will in general have other edges incident on it, and so the transformation shown is a special transformation rather than a normal one which inverts all connections to a vertex. It will also be understood that the transformations of FIG. 19 A will also be possible on the vertex, yielding a complete set of special transformations which can create at zero cost any even number of special inversion markings on the edges representing the connections to the XOR/XNOR, and can create at a cost equal to the difference in cost between the XOR and XNOR any odd number of inversion markings on the edges representing the connections to the XOR/XNOR. Finally, it will be understood that if the XOR and XNOR available in the library were of equal cost, each connection to the XOR/XNOR could be inverted independently by converting the gate from an XOR to an XNOR or vice versa, and so each connection to the XOR/XNOR would be represented in the graph by a separate independent vertex.

These special transformations and the resulting special inversion markings may be used in step 150 of the flow chart of FIG. 2 to correct fundamental cycles, in addition to the insertion of regular inversion markings representing inverters. Step 150 may also include the removal of special inversion markings already placed on edges, as when the zero-cost special transformation of FIG. 19A which adds inversion markings to edges representing two connections to an XOR gate is followed at some later time by the removal of one of these special inversion markings to convert the XOR to an XNOR as in the special transformation of FIG. 19C. The heuristic used in step 150 to determine which inversion markings to add to correct a fundamental cycle will then consider the relative costs of adding an inverter and of performing the special transformations, as well as the placement of inversion markings on edges representing timing critical connections and the number of fundamental cycles made correct and incorrect. Because the special inversion markings do not represent actual inverters, they cannot simply be removed in step 130 as can the normal inversion markings. Therefore step 90 may include the step of performing these special transformations (and adding inverters to maintain the function of the logic network) if necessary to create the lowest cost alternative which can be created by the special transformation, ignoring the cost of any inverters which must be added.

The use of these special transformations will now be shown in the application of the method of the invention to logic circuit 500 in FIG. 20. The circuit library contains an XOR of one cost and an XNOR of some higher cost, the difference between the cost of an XOR and an XNOR being less than the cost of adding an inverter, so the graph representation shown in FIG. 19C will be used for gate B. The circuit library also contains AND, OR, NAND, and NOR gates of equal cost, so the graph representation of FIG. 4A will be used for gates A and C. The resulting graph is shown in FIG. 21A, in which vertex AI represents the connections to the input of gate A, vertex AO represents the connections to the output of gate A, vertex CI represents the connections to the input of gate CI, vertex CO represents the connections to the output of gate C, and the uninvertible vertex U represents connections to gate B and to all primary inputs and outputs.

Figure 22:
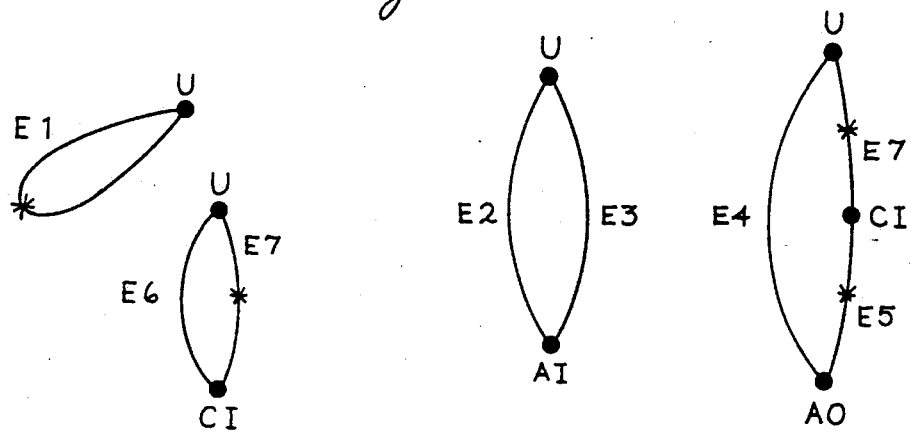
FIG. 22 shows the even and odd fundamental cycles in the graph of FIG. 21A.

A table indicating which network connection is represented by each edge is shown in FIG. 21B. FIG. 22 shows the even and odd fundamental cycles of the graph of FIG. 21A generated by a depth first search beginning at vertex U.

Upon reaching step 160 (FIG. 2), the method chooses the fundamental cycle containing only vertex U and edge E1 to correct, since it is the smallest. This fundamental cycle and fundamental cycle U-CI can both be corrected by applying the special transformation shown in FIG. 19A, adding a special inversion marking to edges E1 and E7. Fundamental cycles U and U-CI are then moved to the correct list, fundamental cycle U-CI-AO is moved to the incorrect list. Further the method loops back through the inquiry in step 140, which is answered "NO" because fundamental cycle U-CI-AO is now incorrect, to step 150 again where this single remaining incorrect fundamental cycle will be corrected. This cycle could also be corrected at zero cost by removing the special inversion marking from edge E7 or adding a special inversion marking to edge E4 and also removing the special inversion marking from edge E1, but this would cause at least one of the smaller correct fundamental cycles U and U-CI to become incorrect, violating one of the conditions of the heuristic. Accordingly, such a cycle correction is not performed. Instead, a single special inversion marking is added to edge E4, corresponding to the special transformation shown in FIG. 19C, because the fundamental cycle being considered can be corrected by this single addition edge E4 and because the cost of this special transformation is less than the cost of adding a normal inversion marking (i.e., an inverter), that being the only other alternative available for correcting the fundamental cycle.

Figure 23:
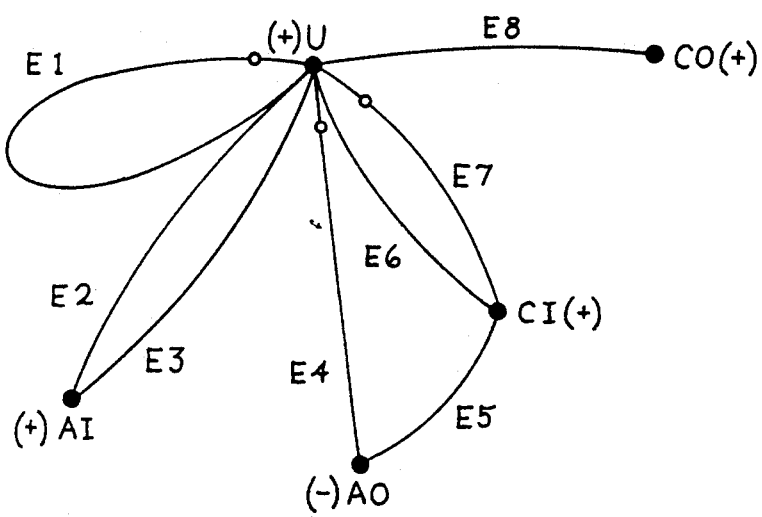
FIG. 23 is the graph of FIG. 21A with the final inversion markings and vertex designations.

The method now proceeds to step 170 (FIG. 2), in which the inversion markings of the graphs of FIGS. 21A and 23 are compared and the vertices designated. FIG. 23 shows the graph of FIG. 21A with the final set of inversion markings and vertex designations.

Figure 24:
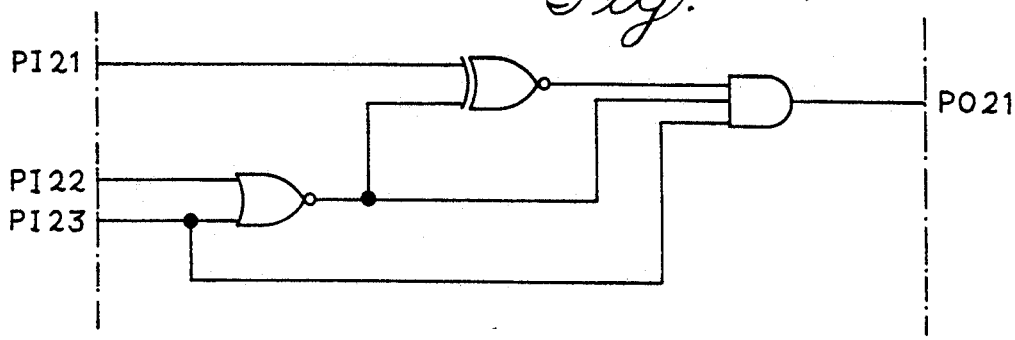
FIG. 24 shows the final result after applying the method of FIG. 2 to the circuit diagram of FIG. 20.

The method then proceeds to the final step 180 in which all inverters are removed, because there are no regular inversion markings in the final graph, and in which a transformation is applied at the output of gate A, changing it from an OR to a NOR, because vertex AO was designated (−). Because the special inversion markings present in the graph correspond to the transformation of gate B from an XOR to a XNOR, this transformation is also performed, resulting in a final circuit as shown in FIG. 24.

Although the present invention has been shown and described with reference to particular embodiments, various changes and modifications obvious to one skilled in the art to which the invention pertains are deemed within the spirit, scope, and contemplation of the invention.

What is claimed is:

1. A logic synthesis method for optimizing a logic network, comprising the steps of:
    expressing the logic network as an original graph having a plurality of vertices each representing a set of connections within the logic network which can be simultaneously inverted without modifying the function of the logic network and without increasing the cost of the logic network, a plurality of edges which connect the vertices and which represent connections in the logic network, and inversion markings, disposed on the edges, for representing inverters in the logic network;
    determining at least one fundamental cycle in the original graph, the at least one fundamental cycle being those vertices and edges of the original graph which form a loop and from which any other loops in the original graph can be derived;
    sorting the determined at least one fundamental cycle in accordance with a parity of the determined at least one fundamental cycle, the parity being determined in accordance with an odd and even number of inversion markings in the at least one fundamental cycle;
    forming a final graph by processing the at least one fundamental cycle so as to optimize inverter placement therein while maintaining the parity of the at least one fundamental cycle;
    comparing the inversion markings of the original and final graphs to determine a set of transformation locations in the logic network; and
    re-configuring the logic network in accordance with the determined transformation locations.

2. The method according to claim 1, wherein said determining step includes conducting a depth first search.

3. The method according to claim 1, wherein said final graph forming step includes removing inversion markings from the graph, thereby forming an inversion-free graph.

4. The method according to claim 3, wherein an inversion marking is applied to a sorted odd fundamental cycle having a fewest number of vertices.

5. The method according to claim 3, wherein said final graph forming step further includes applying a fewest number of inversion markings to the edges of the inversion-free graph such that an optimal number of sorted odd fundamental cycles of the tree graph are odd.

6. The method according to claim 5, wherein said final graph forming step further includes applying a fewest number of inversion markings to the edges of the inversion-free graph such that an optimal number of sorted even fundamental cycles remain even.

7. The method according to claim 1, further comprises storing information representing edges which are timing critical, and wherein said final graph forming step includes adding inversion markings only on those edges which are not timing critical.

8. The method according to claim 1, wherein said final graph forming step includes applying a transformation which inverts a connection by adding an inverter to the connection.

9. The method according to claim 1, wherein said final graph forming step includes applying a transformation which inverts a connection without adding an inverter to the connection.

10. The method according to claim 1, wherein said expressing step includes applying a transformation which re-configures the logic network such that the reconfigured logic network is of lower cost than the logic network, and includes adding inverters to the reconfigured logic network such that a function of the reconfigured logic network is equal to a function of the logic network.

11. The method according to claim 1, wherein said re-configuring step further includes designating vertices in accordance with said comparison.

12. The method according to claim 1, further comprising storing transformations for circuit elements of the logic network, and wherein said re-configuring step includes applying stored transformations to said designated vertices.

13. The method according to claim 1, further comprising a step of inputting cost information representing a cost of a logic transformation.

14. The method according to claim 1, wherein one of said vertices is an uninvertible vertex which represents all connections in the logic network which cannot be inverted 15. A logic synthesizer for optimizing a logic network, comprising:

means for expressing the logic network as an original graph having a plurality of vertices each representing a set of connections within the logic network which can be simultaneously inverted without modifying the function of the logic network and without increasing a cost of the logic network, a plurality of edges which connect the vertices and which represent connections in the logic network, and inversion markings, disposed on the edges, for representing inverters in the logic network;

means for determining at least one fundamental cycle in the original graph, the at least one fundamental cycle being those vertices and edges of the original graph which form a loop and from which any other loops in the original graph can be derived;

means for sorting the determined at least one fundamental cycle in accordance with a parity of the determined at least one fundamental cycle, the parity being determined in accordance with an odd and even number of inversion markings in the at least one fundamental cycle;

means for forming a final graph by processing the at least one fundamental cycle so as to optimize inverter placement therein while maintaining the parity of the at least one fundamental cycle;

a comparator for comparing the inversion markings of the original and final graphs to determine a set of transformation locations in the logic network; and means for re-configuring the logic network in accordance with the determined transformation locations.

16. The logic synthesizer according to claim 15, representing a transformation for at least one of an AND gate, an OR gate, a NOR gate, a NAND gate, an EXCLUSIVE OR gate, an EXCLUSIVE NOR gate, a full adder circuit, a decoder circuit, a multiplexer, a comparator, and a latch circuit.

* * * * *